(12) United States Patent
Masui et al.

(10) Patent No.: US 10,353,254 B2
(45) Date of Patent: Jul. 16, 2019

(54) ELECTRO-OPTICAL DEVICE AND ELECTRONIC APPARATUS

(71) Applicant: SEIKO EPSON CORPORATION, Tokyo (JP)

(72) Inventors: Junichi Masui, Matsumoto (JP); Tomoaki Miyashita, Shimosuwa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/645,245

(22) Filed: Jul. 10, 2017

(65) Prior Publication Data

US 2018/0031892 A1  Feb. 1, 2018

(30) Foreign Application Priority Data

Jul. 26, 2016  (JP) .................................. 2016-146310
Jul. 26, 2016  (JP) .................................. 2016-146311

(51) Int. Cl.
| | |
|---|---|
| *H05K 1/02* | (2006.01) |
| *H05K 1/11* | (2006.01) |
| *H05K 1/14* | (2006.01) |
| *G02F 1/1345* | (2006.01) |
| *G02F 1/1362* | (2006.01) |

(52) U.S. Cl.
CPC ...... *G02F 1/13452* (2013.01); *G02F 1/13458* (2013.01); *G02F 1/136286* (2013.01); *H05K 1/0219* (2013.01); *H05K 1/111* (2013.01); *H05K 1/144* (2013.01); *G02F 1/1345* (2013.01); *H05K 2201/049* (2013.01); *H05K 2201/10136* (2013.01)

(58) Field of Classification Search
CPC ............. G02F 1/13452; G02F 1/13458; G02F 1/136286; G02F 1/1345; H05K 1/111; H05K 1/0219; H05K 1/144
See application file for complete search history.

(56) References Cited

U.S. PATENT DOCUMENTS

| | | | | |
|---|---|---|---|---|
| 4,586,789 A | * | 5/1986 | Kishimoto ............ | G02F 1/1345 349/152 |
| 6,700,636 B2 | * | 3/2004 | Kim ...................... | G02F 1/1345 349/139 |
| 7,050,135 B2 | * | 5/2006 | Kim ...................... | G02F 1/1345 349/104 |
| 8,547,304 B2 | * | 10/2013 | Ito ........................ | G09G 3/3688 345/76 |
| 9,055,684 B2 | * | 6/2015 | Xie ........................ | H05K 1/117 |

(Continued)

FOREIGN PATENT DOCUMENTS

| | | |
|---|---|---|
| JP | 2006-285058 A | 10/2006 |
| JP | 2009-194058 A | 8/2009 |

*Primary Examiner* — Nathan Milakovich
(74) *Attorney, Agent, or Firm* — Oliff PLC

(57) ABSTRACT

An electro-optical device includes a substrate, a first terminal that is formed on the substrate, a second terminal that is formed on the substrate and arranged in a first direction with respect to the first terminal, a third terminal that is formed on the substrate, and arranged in a second direction different from the first direction with respect to the first terminal, and of which the position in the first direction is the same as the first terminal, and a wiring that is formed on the substrate and connected to the third terminal.

12 Claims, 20 Drawing Sheets

(56) References Cited

U.S. PATENT DOCUMENTS

| | | | |
|---|---|---|---|
| 10,028,389 B2 * | 7/2018 | Li | H05K 1/118 |
| 10,032,804 B2 * | 7/2018 | Takahashi | G02F 1/1345 |
| 2017/0164474 A1 * | 6/2017 | Kim | H05K 1/111 |
| 2018/0031936 A1 * | 2/2018 | Enami | G09G 3/001 |

* cited by examiner

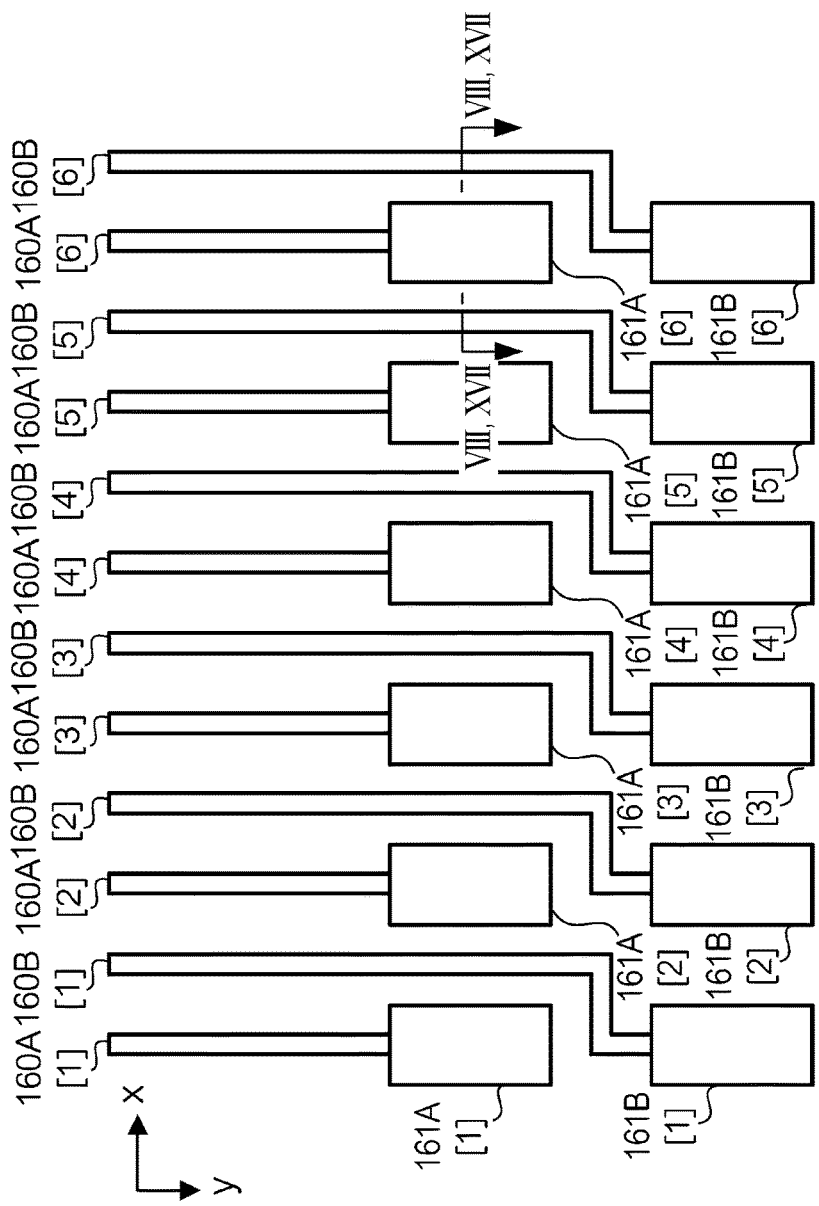

ELECTRO-OPTICAL DEVICE AND ELECTRONIC APPARATUS

BACKGROUND

1. Technical Field

The present invention relates to an electro-optical device and an electronic apparatus.

2. Related Art

In an electro-optical device such as a liquid crystal panel, there is a problem that the number of terminals necessary for packaging with high definition increases. On the other hand, in JP-A-2009-194058, a technique of arranging electrode pad portions in a zigzag manner is disclosed.

In recent years, with the high resolution of an electro-optical device, the number of terminals used for packaging tends to increase. When the number of terminals increases, there is a problem that the arrangement area of the terminals and the area used for routing of wirings are increased, therefore the electro-optical device cannot be downsized. Also, the difference in the length of routed wirings becomes large, which may cause problems in the display quality of the electro-optical device.

SUMMARY

An advantage of some aspects of the invention is to provide a technique for suppressing an increase in an area used for arranging the terminals and an area used for routing of wirings in the electro-optical device, and providing compact, high-definition, and high-quality display.

As an aspect of the invention provides an electro-optical device including a substrate, a first terminal that is formed on the substrate, a second terminal that is formed on the substrate and arranged in a first direction with respect to the first terminal, a third terminal that is formed on the substrate and arranged in a second direction different from the first direction with respect to the first terminal and of which the position in the first direction is the same as the first terminal, and a wiring that is formed on the substrate and connected to the third terminal.

In this electro-optical device, the wiring connected to the third terminal may be arranged to pass between the first terminal and the second terminal.

According to the electro-optical device, it is possible to reduce the area used for routing of wirings, and further downsize the entire device.

The electro-optical device may further include a first wiring layer and a second wiring layer formed on the substrate, in which the first terminal and the second terminal may be formed on the first wiring layer, and the wiring connected to the third terminal may be formed on the second wiring layer.

According to the electro-optical device, it is possible to reduce interference between the wiring connected to the third terminal and the first terminal and the second terminal.

The electro-optical device may further include a third wiring layer formed on the substrate, in which in the area where the first terminal or the second terminal overlaps with the third wiring layer, the first wiring layer, the second wiring layer, and the third wiring layer may be conducted.

According to the electro-optical device, it is possible to improve the terminal redundancy.

In the wiring connected to the third terminal, a wiring width between the first terminal and the third terminal may be wider than a wiring width between the first terminal and the second terminal.

According to the electro-optical device, it is possible to reduce the resistance of a first wiring.

The electro-optical device may further include a fourth terminal that is formed on the substrate and arranged in the first direction with respect to the third terminal, and a wiring that is formed on the substrate, arranged at a position passing between the third terminal and the fourth terminal, and connected to the second terminal, in which a wiring width of the wiring connected to the second terminal may be narrower than a wiring width between the first terminal and the third terminal of the wiring connected to the third terminal.

According to the electro-optical device, it is possible to improve the flatness of the area where wirings are formed.

The electro-optical device may further include a shield wiring for shielding the wiring connected to the third terminal.

According to the electro-optical device, it is possible to reduce interference to the wiring connected to the third terminal.

In the electro-optical device, the wiring connected to the third terminal may overlap with the first terminal via an insulation layer.

According to the electro-optical device, it is possible to reduce the area used for routing of wirings, as compared with the example in which the wirings connected to the first terminal and the third terminal are formed on the same wiring layer.

The electro-optical device may further include a conductive layer of the outermost surface where the first terminal and the second terminal are formed, a second conductive layer from the outermost surface where a conductive pattern is short-circuited with the conductive layer of the outermost surface is formed, in the first terminal or the second terminal, and a third conductive layer from the outermost surface where the wiring connected to the third terminal is formed.

According to the electro-optical device, it is possible to make the first terminal and the second terminal redundant.

The electro-optical device may further include a conductive layer of the outermost surface where the first terminal and the second terminal are formed, a conductive layer that is closest to the substrate where the wiring connected to the third terminal is formed, and a second conductive layer from the substrate where a conductive pattern to be short-circuited with the wiring connected to the third terminal is formed.

According to the electro-optical device, it is possible to make the wiring connected to the third terminal redundant.

The electro-optical device may further include a first conductive layer of the outermost surface where the first terminal and the second terminal are formed, a second conductive layer of the third and subsequent layers from the outermost surface where a conductive pattern to be short-circuited with the first conductive layer is formed in the first terminal or the second terminal, and a conductive layer between the first conductive layer and the second conductive layer where the wiring connected to the third terminal is formed.

According to the electro-optical device, it is possible to make the first terminal and the second terminal redundant.

The electro-optical device may further include the first conductive layer where the first terminal and the second terminal are formed, the second conductive layer which is different from the first conductive layer where the wiring connected to the third terminal is formed, and a conductive layer between the first conductive layer and the second conductive layer where a pattern for shielding the wiring connected to the third terminal from the first terminal or the second terminal is formed.

According to the electro-optical device, it is possible to suppress the interference between the wiring connected to the first terminal, the second terminal, and the third terminal.

The electro-optical device may further include with a first wiring substrate that is connected to the first terminal and a second wiring substrate that is connected to the third terminal.

In addition, the first wiring substrate and the second wiring substrate may have the same function and may have the same shape.

Further, in the electro-optical device, the first wiring substrate may include a first drive circuit which supplies video signals to a first pixel group, and the second wiring substrate may include a second drive circuit which supplies video signals to a second pixel group different from the first pixel group.

In addition, the first wiring substrate and the second wiring substrate may be connected at one side of the substrate.

Further, the first wiring substrate may be connected at a first side of the substrate, and the second wiring substrate may be connected at a second side opposite to the first side.

Another aspect of the invention provides an electronic apparatus including one of the electro-optical devices described above.

According to this electronic apparatus, it is possible to reduce the area used for wire routing, and further downsize the entire device.

BRIEF DESCRIPTION OF THE DRAWINGS

The invention will be described with reference to the accompanying drawings, wherein like numbers reference like elements.

FIG. 6 is a diagram showing a positional relationship between a video signal line and a video signal input terminal.

DESCRIPTION OF EXEMPLARY EMBODIMENTS

1. Structure

Figure 1:
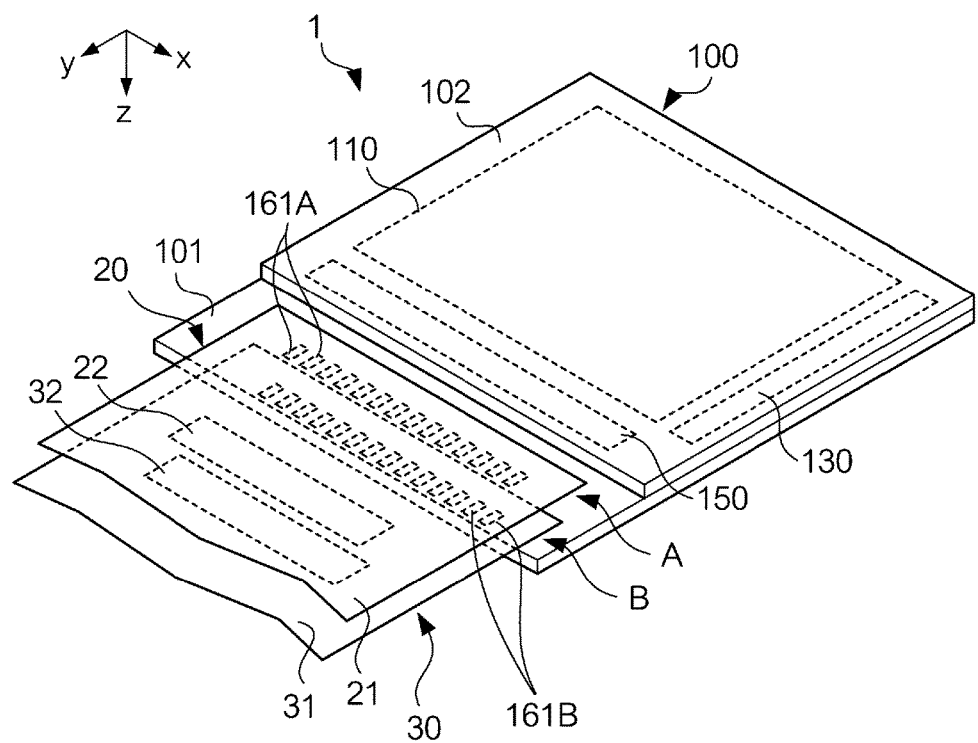
FIG. 1 is a perspective diagram showing a configuration of an electro-optical device according to one embodiment.
Figure 2:
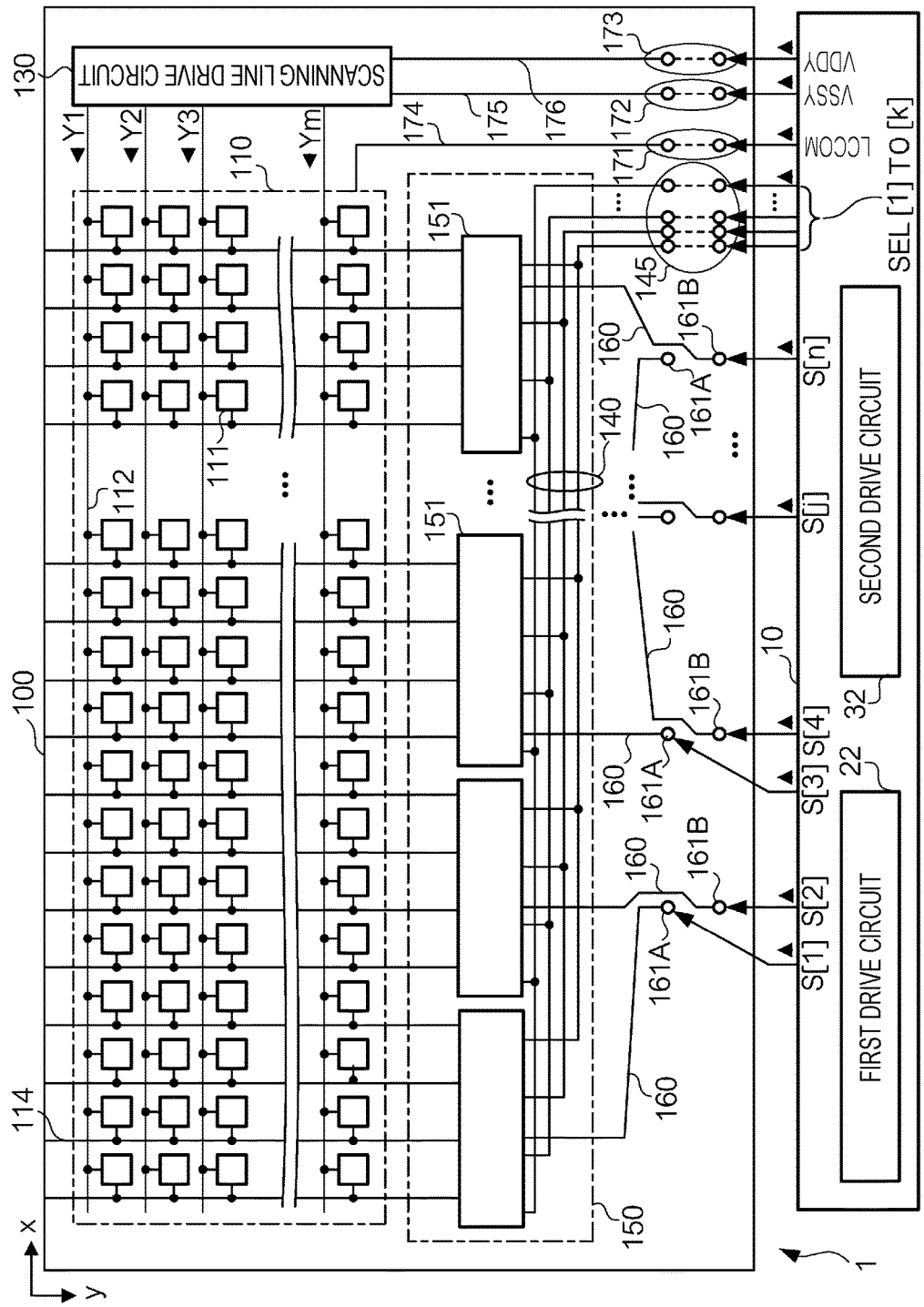
FIG. 2 is a schematic diagram showing a configuration of the electro-optical device.

FIG. 1 is a perspective diagram showing a configuration of the electro-optical device 1 according to one embodiment, and FIG. 2 is a schematic diagram showing a configuration of the electro-optical device 1. The electro-optical device 1 includes an electro-optical panel 100, a first wiring substrate 20, and a second wiring substrate 30. The electro-optical device 1 is a device used for displaying an image, and used as a light valve of a projector as one example.

The electro-optical panel 100 changes the optical state thereof according to a given signal, that is, forms an image.

In this example, the electro-optical panel 100 is a transparent liquid crystal panel. The electro-optical panel 100 includes an element substrate 101, an opposing substrate 102, and a liquid crystal (not shown in the diagram). The element substrate 101 and the opposing substrate 102 are stuck together with a gap therebetween. The liquid crystal is sealed in this gap and forms a liquid crystal layer. The liquid crystal is, for example, a Vertical Alignment (VA) type liquid crystal. The element substrate 101 (an example of the first substrate) is a substrate where a pixel electrode (not shown in the diagram) and a circuit element (a transistor, or the like, not shown in the diagram) for writing a voltage to the pixel electrode thereof are formed. The opposing substrate 102 (an example of the second substrate) is a substrate where a common electrode (not shown in the diagram) is formed. Both the element substrate 101 and the opposing substrate 102 are formed of a light-transmitting material such as glass or quartz.

The first wiring substrate 20 and the second wiring substrate 30 are for connecting the electro-optical panel 100 to another device such as a circuit board. The first wiring substrate 20 includes a wiring formed on a Flexible Printed Circuit (FPC) substrate 21 and a first drive circuit 22. The second wiring substrate 30 includes a wiring formed on an FPC substrate 31 and a second drive circuit 32. The first wiring substrate 20 and the second wiring substrate 30 are a so-called Chip On Film (COF). The first wiring substrate 20 includes a connection area (not shown) for connecting with a terminal group A including a video signal input terminal 161A and the like of the electro-optical panel 100. The second wiring substrate 30 includes a connection area (not shown) for connecting with a terminal group B including a video signal input terminal 161B and the like of the electro-optical panel 100. Due to the terminal groups and the connection areas, the electro-optical panel 100 is electrically connected to the first wiring substrate 20 and the second wiring substrate 30.

The electro-optical panel 100 includes a pixel area 110, a scanning line drive circuit 130, a data line selection circuit 150, n pieces of video signal lines 160, n pieces of video signal input terminals 161, k pieces of selection signal lines 140, k pieces of selection signal input terminals 145, a plurality of power supply terminals 171, 172, and 173, and power lines 174, 175, and 176 corresponding thereto. n is an integer of 2 or more, and k is an integer of 2 or more. In the example of FIG. 2, k=4. These elements are formed on the element substrate 101. The data line selection circuit 150 is formed along one side of a peripheral portion of the pixel area 110 of the element substrate 101, and the scanning line drive circuit 130 is formed along another side that intersects the side where the data line selection circuit 150 is formed. The terminal groups A and B are formed on the side opposite to the pixel area 110, that is, on the end side of the substrate with respect to the data line selection circuit 150.

In this example, a drive circuit 10 including the first drive circuit 22 and the second drive circuit 32 is used to drive a large number of pixels of high definition display at high speed. The first drive circuit 22 and the second drive circuit 32 output the video signal indicating the image to be displayed on the electro-optical panel 100 according to a clock signal, a control signal, and a video signal input from an external upper circuit. The electro-optical panel 100 displays the image according to the clock signal and the video signal input from the first drive circuit 22 and the second drive circuit 32, and other circuits. In this example, the first drive circuit 22 and the second drive circuit 32 are a drive circuit with the same function, and it is possible to output the same signal except a data signal.

The pixel area 110 is an area for displaying an image. The pixel area 110 includes m pieces of scanning lines 112, (k×n) pieces of data lines 114, and (m×k×n) pieces of pixels 111. m is an integer of 1 or more. The pixels 111 are provided corresponding to the intersection of the scanning line 112 and the data line 114 and arranged in a matrix of m rows×(k×n) columns. The scanning line 112 is a signal line transmitting a scanning signal and is provided along the row direction (x direction) from the scanning line drive circuit 130. The data line 114 is a signal line for transmitting a data signal and is provided in the column direction (y direction) from the data line selection circuit 150. The scanning line 112 and the data line 114 are electrically insulated. In addition, in this example, k×m pieces of pixels 111 corresponding to k pieces (columns) of data lines 114 form one a pixel group (block). Considering the pixels 111 in one column as one sub-pixel group, one pixel group is formed of k pieces (columns) of sub-pixel groups. The pixels 111 belonging to a pixel group are connected to the same video signal line 160 via the data line selection circuit 150. That is, the electro-optical panel 100 includes n pieces (columns) of pixel groups divided into n pieces of blocks by n pieces (columns) of video signal lines 160 or n pieces of video signal input terminals 161. The details of the pixels 111 will be described later. In the following description, when it is necessary to distinguish each of the plurality of the scanning lines 112, each scanning line is expressed as the scanning line 112 in the first row, the second row, the third row, . . . , and the m-th row. When it is necessary to distinguish each of the plurality of the data lines 114, each date line is expressed as the data line 114 in the first column, the second column, the third column, . . . , and the (k×n)th column. The same applies to the video signal line 160. In addition, in this example, the k pieces of sub-pixel groups forming one pixel group or the corresponding k pieces of data lines 114 are sequentially arranged in the row direction, but the sub-pixel groups or the data lines are not necessarily sequentially arranged.

The scanning line drive circuit 130 selects a row to write data out of a plurality of the pixels 111 arranged in a matrix. Specifically, the scanning line drive circuit 130 outputs a scanning signal for selecting one scanning line 112 from the plurality of the scanning lines 112. The scanning line drive circuit 130 supplies the scanning signals Y1, Y2, Y3, . . . , and Ym to the scanning line 112 in the first row, the second row, the third row, . . . , and the m-th row. In this example, the scanning signals Y1, Y2, Y3, . . . , and Ym are signals which are of an exclusively sequential at high level.

The data line selection circuit 150 selects the columns of the pixels 111 in which data is written in each pixel group. Specifically, the data line selection circuit 150 selects at least one data line 114 from the k pieces of data lines 114 belonging to the pixel group according to selection signals SEL[1] to SEL[k]. The data lines 114 are connected to the video signal lines 160, one by one, in units of k pieces of data lines by the data line selection circuit 150. The data line selection circuit 150 includes n pieces of demultiplexers 151 corresponding to each of the n pixel groups. The details of the demultiplexer 151 will be described later.

The video signal line 160 connects between a video signal input terminal 161 and the data line selection circuit 150. The video signal line 160 is a signal line that transmits video signals S (S[1] to S[n]) input from the first wiring substrate 20 and the second wiring substrate 30 via the video signal input terminal 161 to the data line selection circuit 150, and n columns (pieces) of signal lines are provided corresponding to each of the n pieces of video signal input terminals 161 or n pieces of pixel groups. The video signals S are signals indicating data written in the pixels 111. Here, "video" means a still image or a moving image. One video signal line 160 is connected to k pieces of data lines 114 via the data line selection circuit 150. Therefore, in the video signals S, the data supplied to k pieces of data lines 114 are time-division multiplexed.

The selection signal line 140 connects between the selection signal input terminal 145 and the demultiplexer 150 of the data line selection circuit 150. The selection signal lines 140 (140[1] to 140[k]) are signal lines that transmit the selection signals SEL (SEL[1] to SEL[k]) input from the selection signal input terminals 145 (145[1] to 145[k]), and k pieces of signal lines are provided. The selection signal SEL is a signal which sequentially becomes a signal with a high level.

The video signal input terminal 161 is a terminal (electrode pad) connected to the first wiring substrate 20 and the second wiring substrate 30, and the video signal S[j] is supplied (j is an integer satisfying $1 \leq j \leq n$). In this example, the video signals S[1], S[3], S[5], . . . , and S[$2t-1$] are supplied to the video signal input terminal 161 corresponding to the video signal lines 160 in odd columns such as the first column, the third column, the fifth column, . . . , and the ($2t-1$)th column from the first drive circuit 22 of the first wiring substrate 20 (t is an integer satisfying $1 \leq t \leq n/2$). In addition, the video signals S[2], S[4], S[6], . . . , and S[$2t$] are supplied to the video signal input terminal 161 corresponding to the video signal lines 160 in even columns such as the second column, the fourth column, the sixth column, . . . , and the ($2t$)th column from the second drive circuit 32 of the second wiring substrate 30. The video signal S is a so-called data signal, and in this example, signals having different waveforms according to the display of the image are supplied to the video signal input terminals 161 corresponding to the terminal groups A and B, respectively. For example, the video signal S is an analog signal.

A selection signal input terminal 140 is a terminal (electrode pad) connected to the first wiring substrate 20 and the second wiring substrate 30, and the selection signal SEL is supplied. The selection signal SEL is supplied from both or one of the first drive circuit 22 of the first wiring substrate 20 and the second drive circuit 32 of the second wiring substrate 30. The selection signal SEL is a timing signal for selecting the data line 114 in the data line selection circuit 150, and in this example, as the selection signal SEL, signals having the same waveform are supplied to the selection signal input terminals 140 corresponding to the terminal groups A and B, respectively. For example, the selection signal SEL is a pulse signal.

The power supply terminal 171, the power supply terminal 172, and the power supply terminal 173 are terminals (electrode pads) connected to the first wiring substrate 20 and the second wiring substrate 30, and a source voltage is supplied. The source voltage is a voltage used as a power source in the electro-optical panel 100, and is a DC voltage in this example. The power supply terminal 171 is a terminal for supplying a voltage LCCOM, the power supply terminal 172 is a terminal for supplying a voltage VSSY, and the power supply terminal 173 is a terminal for supplying a voltage VDDY. The voltage LCCOM is a voltage which is a reference potential of a voltage applied to the liquid crystal layer. The voltage VSSY is a voltage which is the power supply potential on the low voltage side in the scanning line drive circuit 130. The voltage VDDY is a voltage which is the power supply potential on the high voltage side in the scanning line drive circuit 130.

Figure 3:
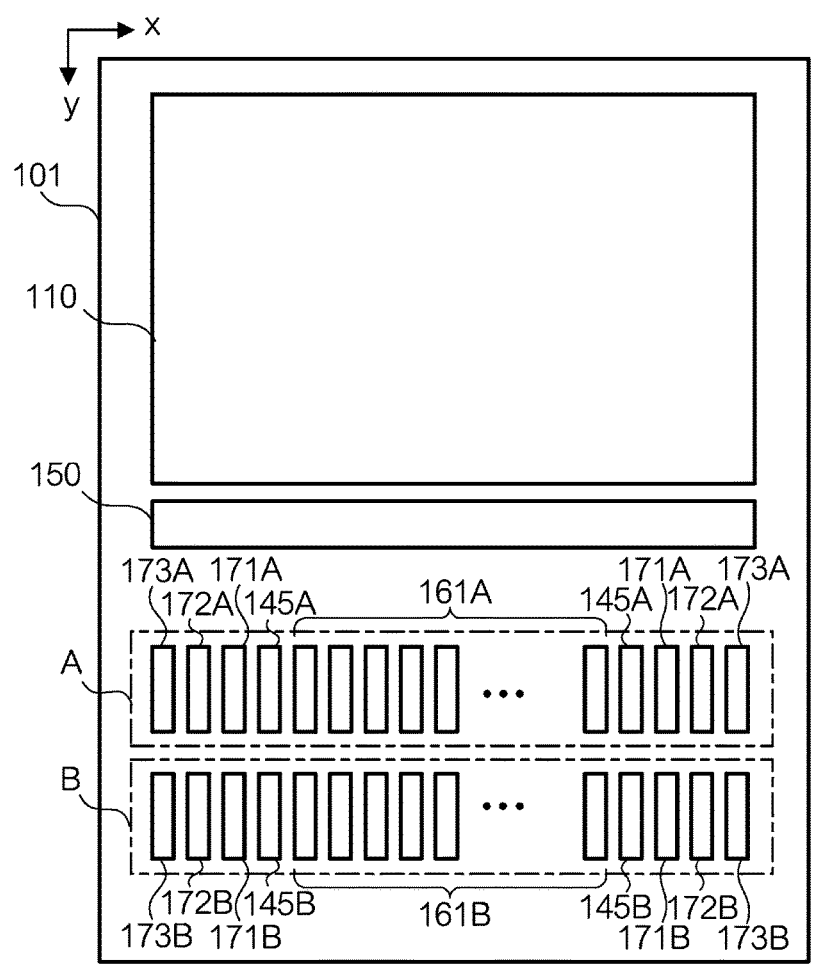
FIG. 3 is a diagram showing an arrangement of terminal groups on an element substrate.

FIG. 3 is a diagram showing the arrangement relationship of the terminal groups A and B in the element substrate 101. As described in FIGS. 1 and 2, the terminal groups A and B are arranged on one side of the peripheral area of the element substrate 101. The terminal group A is the terminal group connected to the first wiring substrate 20, and the terminal group B is the terminal group connected to the second wiring substrate 30. The terminal groups A and B include a plurality of the video signal input terminals 161, a plurality of the selection signal input terminals 145, a plurality of the power supply terminals 171 to 173, and the like. The terminal group B is arranged in the longitudinal direction (column direction) of the element substrate 101 with respect to the terminal group A. In this example, the terminal group B is formed on the side opposite to the pixel area 110 with respect to the terminal group A, that is, on the end side of the substrate.

The terminal group A includes the video signal input terminal 161A, the selection signal input terminal 145A, the power supply terminals 171A to 173A, and each terminal is arranged in a row along the lateral direction (row direction) of the element substrate 101. The terminal group B includes the video signal input terminal 161B, the selection signal input terminal 145B, the power supply terminals 171B to 173B, and each terminal is arranged in a row along the lateral direction of the element substrate 101. The video signal input terminal 161B, the selection signal input terminal 145B, and the power supply terminals 171B to 173B have the same position in the lateral direction and are arranged in the longitudinal direction, respectively, with respect to the video signal input terminal 161A, the selection signal input terminal 145A, and the power supply terminals 171A to 173A, respectively. In addition, in this example, each terminal having the same position in the lateral direction of the terminal group A and the terminal group B is a terminal to which the same type of signal is input, and the shape of the terminal is also the same.

In addition, the number of the video signal input terminals 161A and the video signal input terminals 161B that are arranged is at least n in total. In this example, the number of the video signal input terminals 161A and the video signal input terminals 161B are the same number, and n/2 pieces of terminals are arranged in the middle of the lateral direction of the terminal group.

k pieces of selection signal input terminals 145A and selection signal input terminals 145B are respectively arranged on both sides of the video signal input terminal 161A and the video signal input terminal 161B (in FIG. 3, only one piece is shown on each side). The selection signal input terminal 145A and the selection signal input terminal 145B are provided on both sides, respectively, and therefore it is possible to input the selection signal SEL from both ends of the selection signal line 140. In addition, by providing the selection signal input terminal 145A and the selection signal input terminal 145B, it is possible to input the selection signal SEL from both or one of the first wiring substrate 20 and the second wiring substrate 30. In addition, as the example in FIG. 2, k pieces of selection signal input terminal 145 may be provided on only one side of the video signal input terminals 161, and the selection signal SEL may be input from one end of the selection signal line 140.

The power supply terminals 171A to 173A and the power supply terminals 171B to 173B are provided on both sides of the video signal input terminal 161A and the video signal input terminal 161B, respectively. This is because, for example, the scanning line drive circuit 130 corresponds to a configuration in which one scanning line drive circuit 130 is provided on each of the left and right sides of the substrate 101. As the example in FIG. 2, in the configuration in which only one scanning line drive circuit 130 is used, the selection signal input terminal 145 and the power supply terminals 171 to 173 may be provided on only one side of the video signal input terminal 161.

Also in FIG. 3, the longitudinal direction is the column direction in which the data line 114 extends in the pixel area 110, that is, the y direction. In addition, the lateral direction is the row direction in which the scanning line 112 extends in the pixel area 110, that is, the x direction. The lateral direction is an example of a first direction, and the longitudinal direction is an example of a second direction. In addition, the first and second directions are the longitudinal direction and the lateral direction with respect to the display of the image of a liquid crystal panel 100, respectively.

The terminal group A is an example of the first terminal group, which in this example is the terminal group for connecting to the first wiring substrate 20, and the video signal input terminal 161A, the selection signal input terminal 145A, and the power supply terminals 171A to 173A are arranged in a row along the lateral direction. The power supply terminal 171A, the power supply terminal 172A, and the power supply terminal 173A are examples of a first power supply terminal, a third power supply terminal, and a fourth power supply terminal, respectively. The terminal group B is an example of the second terminal group, which in this example is the terminal group for connecting to the second wiring substrate 30, and the video signal input terminal 161B, the selection signal input terminal 145B, and the power supply terminals 171B to 173B are arranged in a row corresponding to the terminal group A along the lateral direction. The power supply terminal 171B, the power supply terminal 172B, and the power supply terminal 173B are examples of a second power supply terminal, a fifth power supply terminal, and a sixth power supply terminal, respectively.

In the electro-optical panel 100, the terminal group B is arranged in the longitudinal direction (different position in the y direction) with respect to the terminal group A. By providing the two terminal groups of the terminal group A and the terminal group B, the two terminal groups can be connected to different wiring substrates (in this example, the first wiring substrate 20 and the second wiring substrate 30), respectively, and it is possible to drive each terminal group with a different drive circuit (the first drive circuit 22 and a second drive circuit 32 in this example).

Further, since the terminal group A and the terminal group B are arranged in the longitudinal direction, as compared with the case where the terminal group A and the terminal group B are arranged in the lateral direction, it is possible to arrange the spacing between the terminals in the lateral direction in a crude manner (widely), or increase the size of each terminal in the lateral direction.

Figure 4:
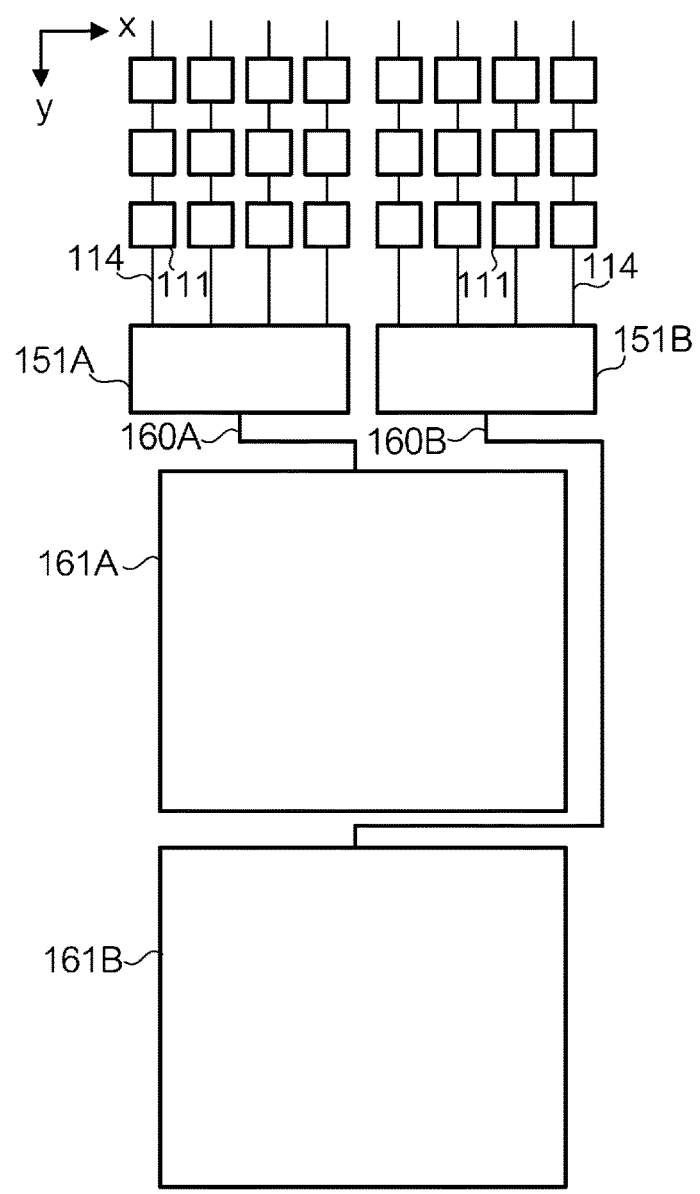
FIG. 4 is a diagram showing a connection relationship between a video signal input terminal and pixels.

FIG. 4 is a diagram showing the connection relationship between the video signal input terminal 161 and the pixels 111. In FIG. 4, among n pieces of pixel groups and n pieces of video signal input terminals 161 shown in the example of FIG. 2, only two consecutive pixel groups and the two video signal input terminals 161 corresponding thereto are shown. In addition, the video signal lines 160 and the demultiplexers 151 corresponding to the two consecutive pixel groups are also shown. In this example, the video signal input terminals 161 are divided into two groups of terminals including the terminals connected to an odd numbered (odd numbered columns) pixel group (block) and the terminals connected to an even numbered (even numbered columns) pixel group (block). Here, the terminals corresponding to the odd numbered pixel group are the video signal input terminals 161A of the terminal group A, and the terminals corresponding to the even numbered pixel group are the video signal input terminals 161B of the terminal group B. A demultiplexer 151A is the demultiplexer 151 corresponding to the odd numbered pixel group and a demultiplexer 151B is the demultiplexer 151 corresponding to the even numbered pixel group. The video signal input terminals 161A are connected to the data lines 114 of the odd numbered pixel group via the odd numbered video signal lines 160 and the demultiplexer 151A. In addition, the video signal input terminals 161B are connected to the data lines 114 of the even numbered pixel group via the even numbered video signal lines 160 and the demultiplexer 151B. The video signal input terminals 161A and the video signal input terminal 161B are different not only in the connected demultiplexers but also in the wiring substrates (drive circuits) to which the video signal S is supplied. In this example, the video signal input terminals 161A and the video signal input terminals 161B are connected to the first wiring substrate 20 and the second wiring substrate 30, respectively, and a video signal is supplied from the first drive circuit 22 and the second drive circuit 32. That is, the video signal input terminals 161A in the first row which is the terminal group A receive video signals S1, S3, S5, . . . , and S(2$t$−1) corresponding to the odd numbered pixel group from the first drive circuit 22. In addition, the video signal input terminals 161B in the second row which is the terminal group B receive video signals S2, S4, S6, . . . , and S(2$t$) corresponding to the even numbered pixel group from the second drive circuit 32. The video signal input terminals 161A of the terminal group A are an example of first video signal input terminals and the video signal input terminals 161B of the terminal group B are an example of second video signal input terminals.

The pixel group connected to the video signal input terminals 161A of the terminal group A is an example of the first pixel group, and the pixel group connected to the video signal input terminals 161B of the terminal group B is an example of the second pixel group. In this example, the first pixel group and the second pixel group are arranged by n/2 pieces in the lateral direction, respectively. Since each the pixel group is provided with k pieces of consecutive data lines 114, the data lines 114 are alternately connected to the video signal input terminals 161A and the video signal input terminals 161B in units of k pieces of consecutive data lines. In addition, the demultiplexer 151 selects a sub-pixel group in one column from the sub-pixel groups in the k columns for each of the first pixel group and the second pixel group. In this example, since k pieces of data lines 114 are consecutive in the row direction, the demultiplexer 151 can be arranged in the row direction (x direction) corresponding to each pixel group, and therefore it is possible to prevent the video signal line 160 from intersecting with each other or the video signal line 160 from intersecting with a wiring affecting a data signal.

Figure 5A:
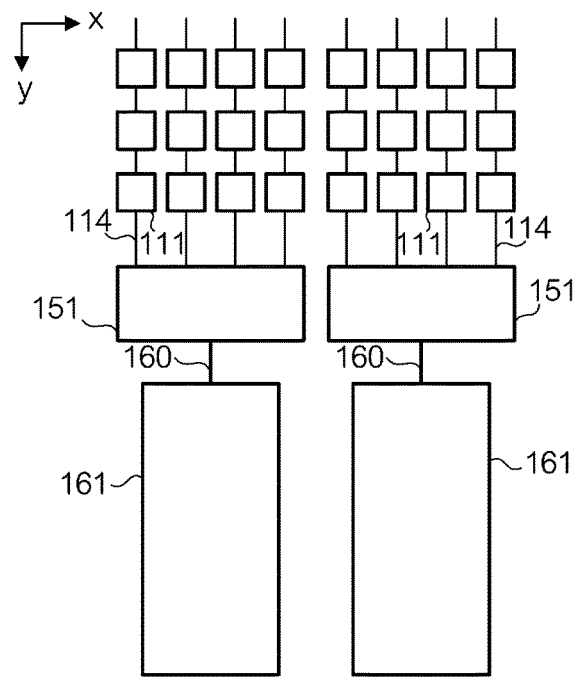
FIGS. 5A and 5B are diagrams showing a configuration of an electro-optical panel according to a comparative example.
Figure 5B:
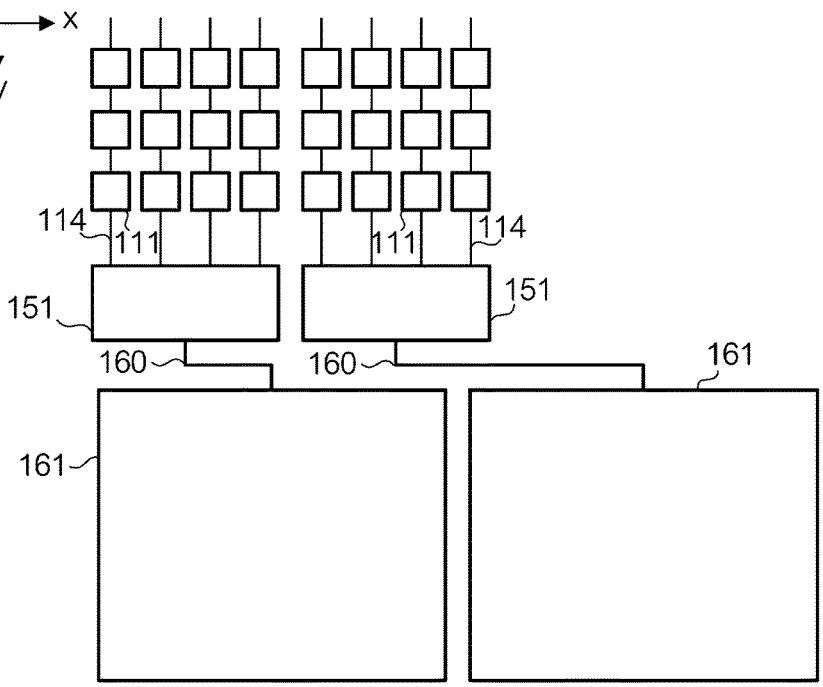

In addition, in this example, one video signal input terminal 161 is connected to four pieces (k=4) of data lines 114 via the data line selection circuit 150. As an example, an example in which four pieces of data lines 114 sequentially arranged in the lateral direction (row direction) with the spacing between the data lines 114 in the pixel area 110 (for example, the distance between the centers of two data lines) set to 6 μm form a block is considered. In the high-definition electro-optical panel 100, the ratio of the video signal input terminal 161 to the size of the arrangement area of the terminal group increases. In the comparative example of FIGS. 5A and 5B in which the video signal input terminal 161 is arranged in one row in the lateral direction, in a case where the size (width) of the arrangement area in the lateral direction (approximately, arrangement area of the terminal group) of the pixel area 110 and the video signal input terminal 161 is set to be approximately the same, the spacing between the adjacent video signal input terminals 161 (distance between the centers of the terminals) is 24 μm (4×6 μm) (FIG. 5A). This means that the size of the electrode pad forming the terminals must be less than 24 μm in order to make the size of the arrangement area of the terminal group and the size of the pixel area 110 almost equal, and advanced ability of packaging wiring substrates and electro-optical panels is required, which is not easy. In addition, in a case where the size of the electrode pad is 48 [μm], the size of the terminal group in the lateral direction is at least n×48 [μm], which is about twice as large as n×24 [μm] (n×4×6 [μm]) corresponding to the size of the pixel area 110 in the lateral direction, and the miniaturization of the electro-optical panel 100 cannot be achieved (FIG. 5B). However, in an example in which the video signal input terminals 161A and the video signal input terminals 161B are arranged in two rows in the longitudinal direction as in the embodiment, the spacing between the adjacent video signal input terminals 161A can be 48 [μm], and a width that can be used as one electrode pad is increased to about twice that of the comparative example, which makes packaging easier. In addition, even if the size of the electrode pad is about 48 [μm], the size of the arrangement area of the video signal input terminal 161 in the lateral direction is n×24 [μm] (n/2×48 [μm]), which is equivalent to n×24 [μm] (n×4×6 [μm]) corresponding to the size of the pixel area 110 in the lateral direction.

If the spacing (pitch) between the data lines 114 is set to d [μm], the spacing (pitch) between the electrode pads of the video signal input terminals 161 is set to p [μm], the number of the terminal groups arranged in the longitudinal direction, that is the number of wiring substrates to which the terminal groups are connected is set to c [pieces], the size of the pixel area 110 in the lateral direction is at least k×n×d [μm], and the size in the lateral direction necessary for arranging the video signal input terminal 161 is at least n/c×p [μm]. (n/c×p<k×n×d) for reducing the size in the lateral direction necessary for arranging the video signal input terminal 161 with respect to the size of the pixel area 110 in the lateral direction, is effective for downsizing the electro-optical panel. That is, if c, p, k and d are determined so as to satisfy the relationship of p/c<k×d, it is possible to realize the electro-optical device 1 in the small size and high definition without depending largely on the capability of the drive circuit, ability of packaging wiring substrates and electro-optical panels, and the like. For example, if k=8, c=2, n=520, and d=6 [μm], the number of the data lines 114 is 4,160 pieces (8×520 pieces), the electro-optical panel 100 can be realized in the small size and high definition with the size of the pixel area 110 in the lateral direction being 24,960 [μm] (6×4,160 [μm]). In this case, the size of one row of the arrangement area of the video signal input terminal 161 in the lateral direction is 260×p [μm] (520/2×p [μm]) and the spacing p between the electrode pads is 96 [[μm] (24,960/260 [μm]), which makes packaging easier. Further, in a case where the size (width) of the electrode pad is set to 56 [μm], the gap in the lateral direction between the electrode pads is 40 μm, a video signal line 160B of about 10 [μm] (for example, 8 to 12 [μm]) can be easily arranged between the video signal input terminals 161A, and routing of wirings from the terminal group arranged in the longitudinal direction becomes also easier.

By respectively connecting the two wiring substrates (the first wiring substrate 21, the second wiring substrate 31) respectively provided with the drive circuits (the first drive circuit 22, the first drive circuit 32) that are capable of outputting 260 video signals S to the terminal groups A and B in two rows, it is easy to package the terminals and to drive 4,160 (8×2×260 pieces) of data lines 114 corresponding to high definition display.

Further, in this example, the pixel group (the first pixel group) driven by the first drive circuit 22 and the pixel group (the second pixel group) driven by the second drive circuit 32 are alternately arranged. In other words, the data lines 114 are alternately arranged for every k pieces, one data lines connected to the first drive circuit 22 and the one other data lines connected to the second drive circuit 32. As a result, for example, as compared with a case where the left half of the entire data lines 114 is connected to the first drive circuit 22 and the right half thereof is connected to the second drive circuit 32, it is possible to suppress the display unevenness due to the variation in the characteristics of the drive circuit.

FIG. 6 is a diagram showing the positional relationship between the video signal line 160 and the video signal input terminal 161 in a terminal area of the element substrate 101. In this example, the video signal line 161B connected to the terminal group B is formed at a position passing between the terminals of the terminal group A. For the sake of description, the video signal input terminal 161A, which is the i-th from the left in the diagram, is denoted as the video signal input terminal 161A[i]. The same applies to the video signal input terminal 161B, the video signal line 160A, and the video signal line 160B. When viewed from the direction perpendicular to the element substrate 101, the video signal line 160B is formed at a position passing between two adjacent video signal input terminals 161A. More specifically, the video signal line 160B[i] is formed at a position passing between the video signal input terminal 161A[i] and the video signal input terminal 161A[i+1]. For example, the video signal line 160B[1] is formed at a position passing between the video signal input terminal 161A[1] and the video signal input terminal 161A[2]. Here, the video signal input terminal 161A[1] is an example of the first terminal, and the video signal input terminal 161A[2] is an example of the second terminal arranged in the first direction (x direction) with respect to the first terminal. The video signal input terminal 161B[1] is an example of the third terminal arranged in the second direction (y direction) different from the first direction with respect to the first terminal. The video signal input terminal 161B[2] is an example of the fourth terminal arranged in the first direction (x direction) with respect to the third terminal. The video signal line 160B[1] is formed at a position passing between the first terminal and the second terminal and is an example of the first wiring connected to the third terminal. In this example, the position in the x direction is the same between the video signal input terminal 161A and the video signal input terminal 161B.

Figure 7:
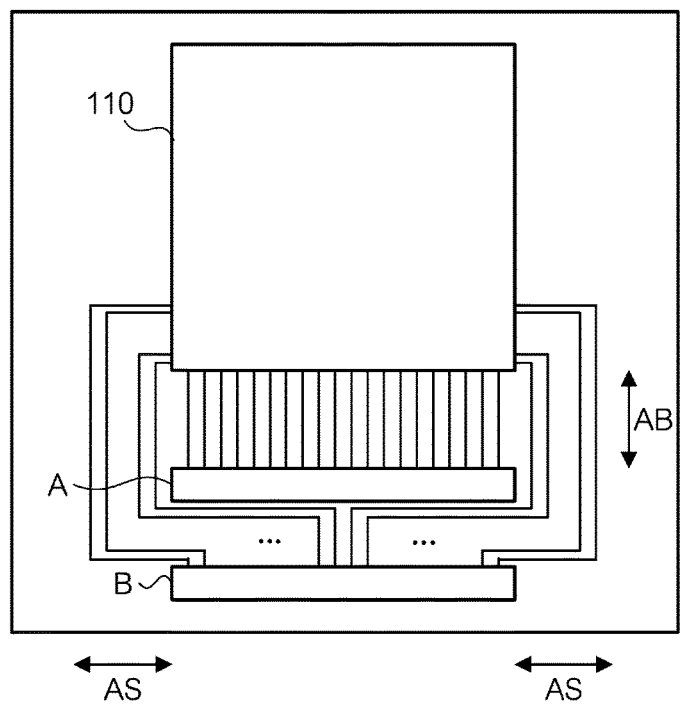
FIG. 7 is a diagram showing a configuration of the electro-optical panel according to a comparative example.

FIG. 7 is a diagram showing a structure of the electro-optical panel according to a comparative example. In this example, a signal line connected to the terminal group B is formed at a position to avoid the entirety of the terminal group A. Compared with the example of FIG. 6, it is necessary that an area AB between the terminal group A and the terminal group B, and the area AS on both sides of the terminal group A and the terminal group B are more widely secured wider than the example in FIG. 6, and therefore the miniaturization of the electro-optical panel becomes hindered. On the other hand, according to the electro-optical panel 100 in the embodiment using the example of FIG. 6, it is not necessary to provide the wiring area of the video signal line 160B, and it is possible to narrow down the area corresponding to the area AB and the area AS in FIG. 7. Therefore, the entire panel can be downsized.

Figure 8:
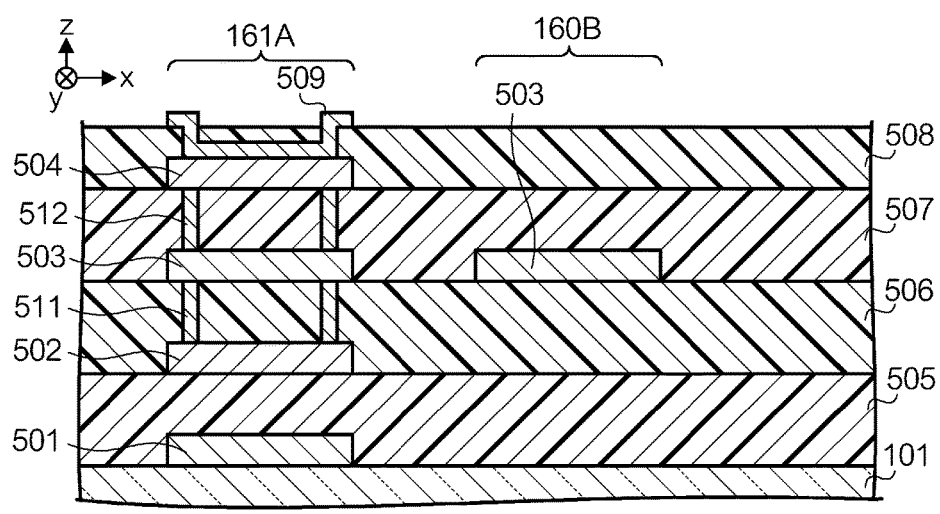
FIG. 8 is a schematic diagram showing a cross-section structure of the video signal line and the video signal input terminal.

FIG. 8 is a schematic diagram showing the cross-section structure of the video signal line 160A and the video signal input terminal 161B. The diagram schematically shows VIII, XVII-VIII, XVII cross section in FIG. 6. In this example, the electro-optical panel 100 includes a so-called multilayer wiring structure. A semiconductor layer 501, a wiring layer 502 (an example of the third wiring layer), a wiring layer 503 (an example of the second wiring layer), and a wiring layer 504 (an example of the first wiring layer) are formed from the substrate side of the element substrate 101. These conductive layers are insulated by insulation films 505 to 508. Further, a cap layer 509 is partially formed on the outermost surface. The semiconductor layer 501 is a layer for forming a transistor for switching, and is formed of, for example, polycrystalline Si or amorphous Si. The wiring layers 502 to 504 are layers for forming other terminals and signal lines as well as the video signal input terminal 161 and the video signal line 160, and are formed of a conductive material such as Al or Cu, or an alloy based thereon. The insulation films 505 to 508 are formed of an insulating material, for example, an oxide such as $SiO_2$ or SiN, nitride, or a resin such as polyimide or polyamide. In the area corresponding to the video signal input terminal 161, the insulation film 508 is etched to obtain electrical contact and the wiring layer 504 is exposed outside the insulation film 508. The cap layer 509 is a layer for protecting the exposed wiring layer 504 and formed by a conductive material such as indium tin oxide (ITO).

In this example, the video signal input terminal 161A is formed in a pattern in which all the semiconductor layer 501, the wiring layer 502, the wiring layer 503, and the wiring layer 504 correspond, and among these, the wiring layer 502, the wiring layer 503, and the wiring layer 504 are short-circuited via a contact hole 511 and a contact hole 512. The reason why the terminal portion is short-circuited over a plurality of layers as described above is to ensure the redundancy of the terminals (for keeping the terminal portion at low resistance). The video signal line 160B is formed only in the wiring layer 503 in this area. The terminals and signal lines other than the video signal input terminal 161A and the video signal line 160B have the same structure. A video signal line 160A connected to the video signal input terminal 161A may be formed on the same wiring layer as the video signal input terminal 161A, or may be formed on the other wiring layer via a contact hole between the layers. In a case where the video signal line 160A is formed on the wiring layer 504, the insulation film 508 is not etched in the area corresponding to the video signal line 160A. Since the wiring layer 501 is a semiconductor layer, the effect of electrical redundancy is weak even if the wiring layer 501 is short-circuited, but the wiring 501 is formed for other redundancy, such as height adjustment of the terminal portion. The wiring layer 501 is formed in the same manner in other areas of the terminal portion.

Figure 9:
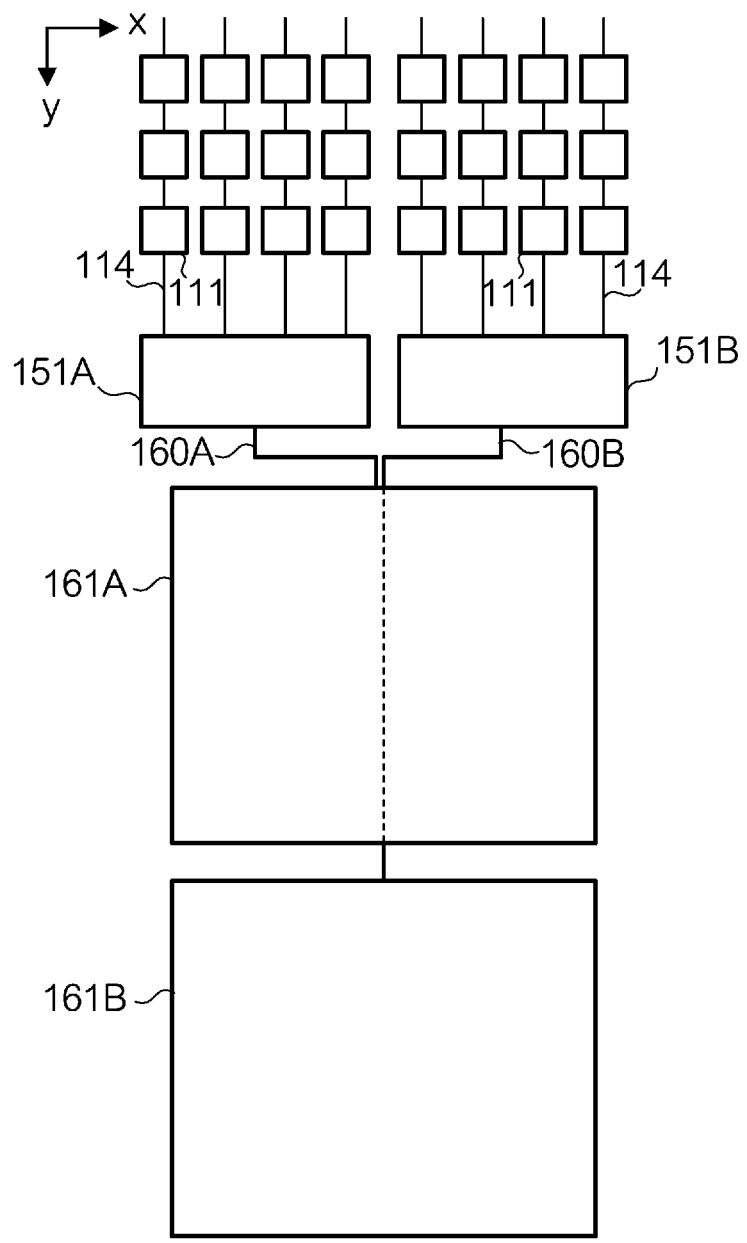
FIG. 9 is a diagram showing another connection relationship between the video signal input terminal and pixels.

FIG. 9 is a diagram showing another connection relationship between the video signal input terminal 161 and the pixels 111. In FIG. 4, the video signal line 160B is formed at a position passing between the video signal input terminals 161A. In FIG. 9, the video signal line 160B is formed at a position overlapping the video signal input terminal 161A or the video signal line 160A via the insulation film.

Figure 10:
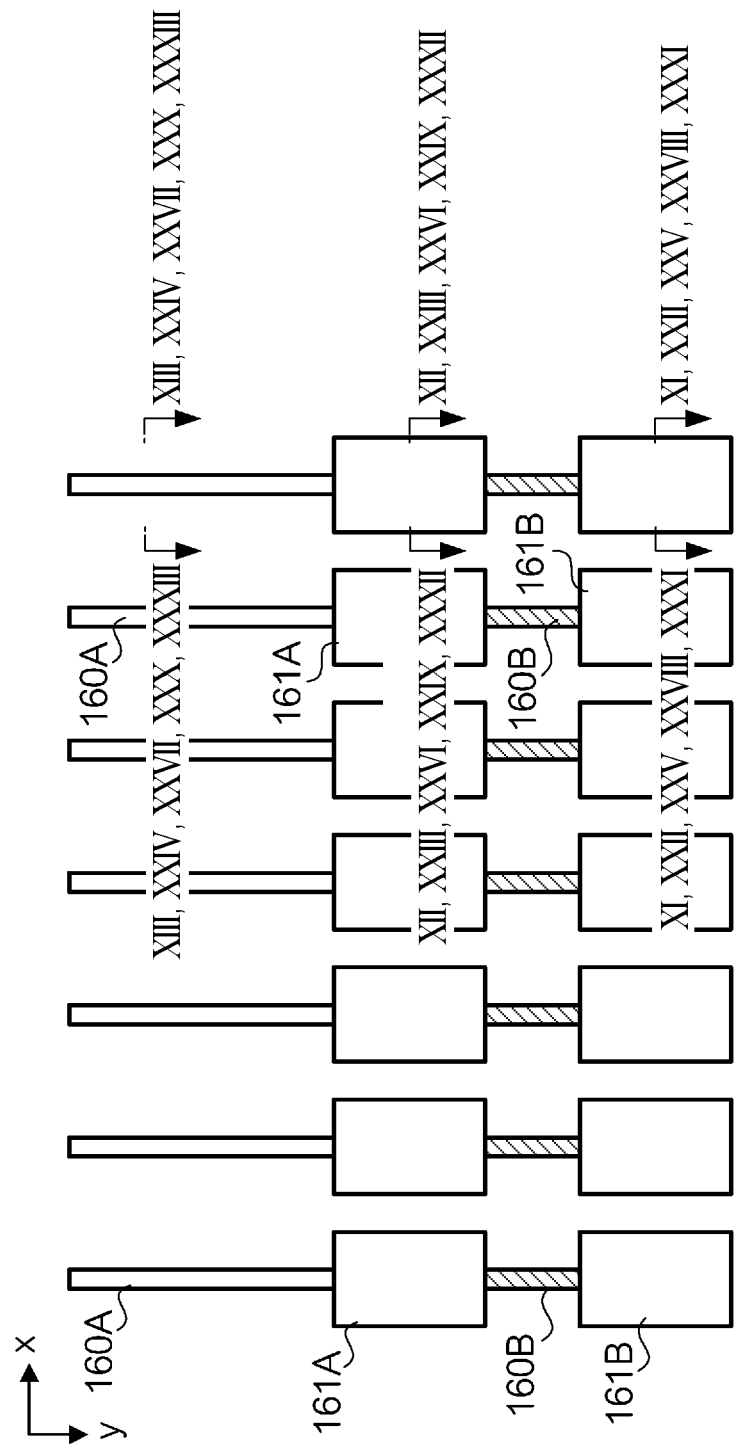
FIG. 10 is a diagram showing a positional relationship between the video signal line and the video signal input terminal in FIG. 9.

FIG. 10 is a diagram showing the positional relationship between the video signal line 160 and the video signal input terminal 161 in the a terminal area of the element substrate 101 in FIG. 9. In this example, when viewed from the direction (z direction) perpendicular to the element substrate 101, the video signal line 161B connected to the terminal group B is formed so as to pass through a position overlapping with the terminals of the terminal group A. For the sake of description, the video signal input terminal 161A, which is the i-th from the left in the diagram, is denoted as the video signal input terminal 161A[i]. The same applies to the video signal input terminal 161B, the video signal line 160A, and the video signal line 160B. When viewed from the direction perpendicular to the element substrate 101, the video signal line 160B is formed so as to pass through a position overlapping the corresponding video signal input terminal 161A. More specifically, the video signal line 160B[i] is formed so as to pass through a position overlapping with the video signal input terminal 161A[i] via the insulation film. Here, the video signal input terminal 161A[1] is an example of the first terminal, and the video signal input terminal 161A[2] is an example of the second terminal arranged in the first direction (x direction) with respect to the first terminal. The video signal input terminal 161B[1] is an example of the third terminal arranged in the second direction (y direction) different from the first direction with respect to the first terminal. The video signal input terminal 161B[2] is an example of the fourth terminal arranged in the first direction (x direction) with respect to the third terminal. The video signal line 160B[1] is formed at a position overlapping with the first terminal via the insulation film and is an example of a first signal line connected to the third terminal. In this example, the position in the x direction is the same between the video signal input terminal 161A and the video signal input terminal 161B.

Figure 11:
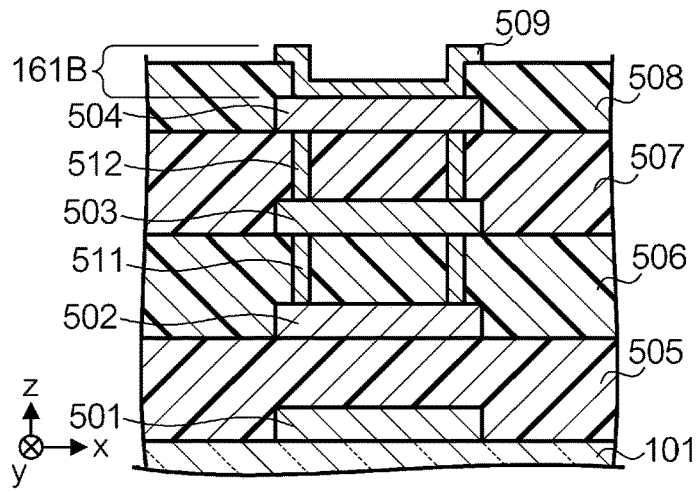
FIG. 11 is a schematic diagram showing a cross-section structure of the video signal input terminal in FIG. 10.

FIG. 11 is a schematic diagram showing a cross-section structure of a video signal input terminal 161B. The diagram shows schematically a cross section at the position where the terminals of XI, XXII, XXV, XXVIII, XXXI-XI, XXII, XXV, XXVIII, XXXI cross section in FIG. 10, that is the terminal group B, are formed. In this example, the electro-optical panel 100 includes a so-called multilayer wiring structure. The semiconductor layer 501, the wiring layer 502, the wiring layer 503, and the wiring layer 504 are formed from the substrate side of the element substrate 101. These layers are insulated by insulation films 505 to 508. Further, a cap layer 509 is partially formed on the outermost surface. The semiconductor layer 501 is a layer for forming a transistor for switching, and is formed of, for example, polycrystalline Si or amorphous Si. The wiring layers 502 to 504 are layers for forming other terminals and signal lines as well as the video signal input terminal 161 and the video signal line 160, and are formed of a conductive material such as Al or Cu, or an alloy based thereon. The insulation films 505 to 508 between the layers are formed of an insulating material, for example, an oxide such as $SiO_2$ or SiN, nitride, or a resin such as polyimide or polyamide. In the area corresponding to the video signal input terminal 161, the insulation film 508 is etched to obtain electrical contact and the wiring layer 504 is exposed outside the insulation film 508. The cap layer 509 is a layer for protecting the exposed wiring layer 504 and formed by a conductive material such as indium tin oxide (ITO).

In this example, the video signal input terminal 161B is formed in a pattern in which all the semiconductor layer 501, the wiring layer 502, the wiring layer 503, and the wiring layer 504 correspond, and among these, the wiring layer 502, the wiring layer 503, and the wiring layer 504 are short-circuited via a contact hole 511 and a contact hole 512. The reason why the terminal portion is short-circuited over a plurality of layers as described above is to ensure the redundancy of the terminals (to keep the terminal portion at low resistance). Among these layers, the wiring layer 502 is a layer where the video signal line 160B is formed. Since the wiring layer 501 is a semiconductor layer, the effect of electrical redundancy is weak even if the semiconductor layer 501 is short-circuited, but the semiconductor layer 501 is formed for other redundancy, such as height adjustment of the terminal portion. The wiring layer 501 is formed in the same manner in other areas of the terminal portion.

Figure 12:
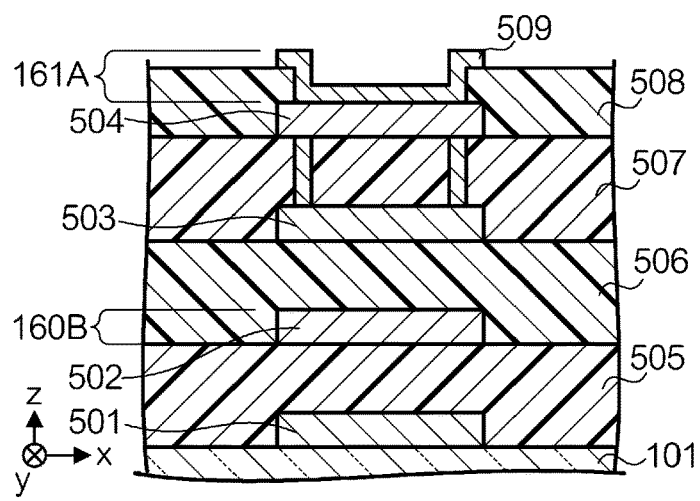
FIG. 12 is a cross-section structure of a video signal line and a video signal input terminal in FIG. 10.

FIG. 12 is a schematic diagram showing the cross-section structure of the video signal line 160B and the video signal input terminal 161A. The diagram shows schematically a cross section at the position where the terminals of XII, XXIII, XXVI, XXIX, XXXII-XII, XXIII, XXVI, XXIX, XXXII cross section in FIG. 10, that is the terminal group A, are formed. In the area in which the video signal input terminal 161B is formed, a corresponding pattern is formed on the wiring layer 503 and the wiring layer 504, and the wiring layer 503 and the wiring layer 504 are short-circuited through the contact hole 512. The pattern of the video signal line 160B is formed on the wiring layer 502.

Figure 13:
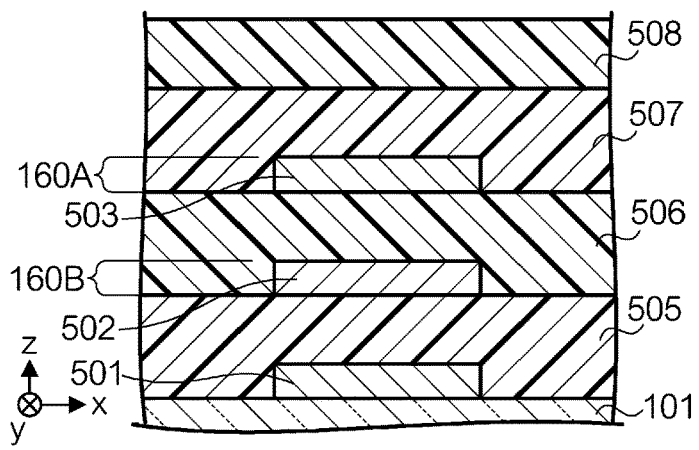
FIG. 13 is a schematic diagram showing a cross-section structure of video signal lines in FIG. 10.

FIG. 13 is a schematic diagram showing the cross-section structure of the video signal line 160A and the video signal line 160B. The diagram schematically shows the cross section at a position between XIII, XXIV, XXVII, XXX, XXXIII-XIII, XXIV, XXVII, XXX, XXXIII cross section in FIG. 10, that is, a position between the terminal group A and the demultiplexer 151. On the wiring layer 503, the pattern of the video signal line 160A is formed, and the pattern of the video signal line 160B is formed on the wiring layer 502.

In this manner, in the multilayer wiring structure, it is possible to form at least the video signal line 160B and the video signal input terminal 161A on different wiring layers, and furthermore, by forming the video signal line 160B and the video signal line 160A on different wiring layers, it is possible to form numerous wirings in a narrow area when viewed from the direction perpendicular to the element substrate 101.

The number of wiring layers is not limited to that illustrated in FIGS. 11 to 13. The electro-optical panel 100 may include at least three wiring layers. In this example, the first terminal (video signal input terminal 161A[1]) and the second terminal (the video signal input terminal 161A[2]) are formed on the layer (wiring layer 504) of the outermost surface among at least three wiring layers. A pattern to be short-circuited with the layers of the first terminal and the second terminal (pattern of the video signal input terminal 161A in the wiring layer 503) is formed on the second layer (wiring layer 503) from the outermost surface among these wiring layers. The first signal line (signal line 160B) is formed on the layer (wiring layer 502) that is the closest to the element substrate 101 among these wiring layers.

Figure 14:
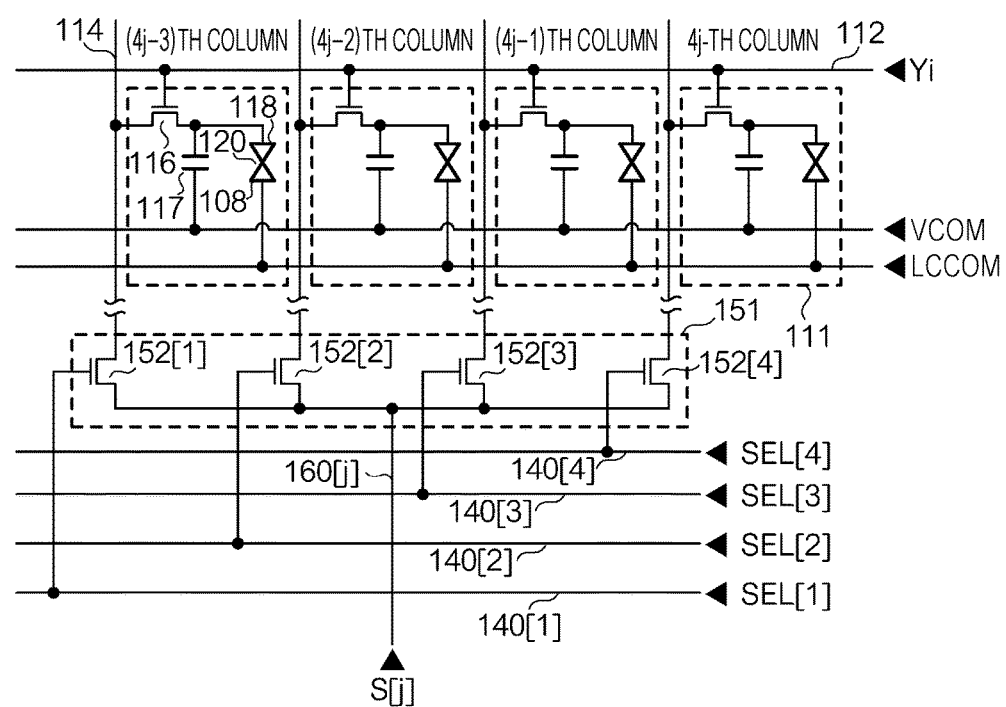
FIG. 14 is a diagram showing an equivalent circuit of the pixels and a data line selection circuit.

FIG. 14 is a diagram showing an equivalent circuit of the demultiplexer 151 of the pixels 111 and the data line selection circuit 150. In FIG. 9, the pixels 111 in the (k×j−k+1)th column to the (k×j)th column of the i-th row of the pixel area 110 and the demultiplexer 151 corresponding thereto are shown (i is an integer satisfying 1≤i≤m). In the i-th row, one block is form of k pieces (k=4 in this example) of consecutive pixels 111. The pixels 111 include a Thin Film Transistor (TFT) 116, a pixel electrode 118, a liquid crystal layer 120, a common electrode 108, and a retention volume 117. The TFT 116 is a switching element for controlling writing (application of voltage) data to the pixel electrode 118, and in this example, is an n-channel type field effect transistor. The gate electrode of the TFT 116 is connected to the scanning line 112, the source electrode is connected to the data line 114, and the drain electrode is connected to the pixel electrode 118. When the scanning line 112 is supplied with a high level of scanning signal, the TFT 116 is turned on and the data line 114 and the pixel electrode 118 are brought into a low impedance state. That is, data is written in the pixel electrode 118. When the scanning line 112 is supplied with a low level of scanning signal, the TFT 116 is turned off and the data line 114 and the pixel electrode 118 are brought into a high impedance state. The common electrode 108 is common to all the pixels 111. The common voltage LCCOM is applied to the common electrode 108, for example, by the first drive circuit 22 and the second drive circuit 32. A voltage corresponding to the potential difference between the pixel electrode 118 and the common electrode 108 is applied to the liquid crystal layer 120, and an optical characteristic (transmittance or reflectance) is changed according to the voltage. The retention volume 117 is connected in parallel with the liquid crystal layer 120 and holds electric charge corresponding to the potential difference between the pixel electrode 118 and the common voltage VCOM (in this example, VCOM=LCCOM). Hereinafter, when distinguishing each of the elements included in the pixels 111 in a particular pixel group, the elements are distinguished by TFT 116[s] (s is an integer satisfying 1≤s≤k).

The demultiplexer 151 is a circuit for supplying the video signal S to the data line 114 selected according to the selection signals SEL[1] to SEL[k]. The video signal S input from the video signal input terminal 161 is supplied to the demultiplexer 151 via the video signal line 160. One demultiplexer 151 includes one video signal input unit, k pieces of selection signal input units, k pieces of video signal output units, k pieces of TFTs 152 (152[1] to 152[k]), and one video signal input terminal 161 via the video signal line 160 and k pieces of selection signal input terminals 145 (145[1] to 145[k]) via the selection signal line 140 are connected with k pieces of data line 114. The TFT 152 is a switching element for selecting the data line 114 according to the selection signal SEL input to the gate.

The gate electrode of the TFT 152[1] is connected to the selection signal line 140[1], the source electrode is connected to the video signal line 160 in the j-th column, the drain electrode is connected to the data line 114 in the (4j−3)th column (that is, the source electrode of the TFT 116[1] in the j-th pixel group). When a high level of selection signal SEL[1] is supplied to the selection signal line 140[1], the TFT 152 is turned on, and the video signal line 160 in the j-th column and the data line 114 in the (4j−3)th column are brought into a low impedance state and become conductive. That is, the video signal S[j] is supplied to the data line 114 in the (4j−3)th column. When a low level of selection signal SEL[1] is supplied to the selection signal line 140[1], the TFT 152[1] is turned off, and the video signal line 160 in the j-th column and the data line 114 in the (4j−3)th column are brought into a high impedance state.

The gate electrode of the TFT 152[2] is connected to the selection signal line 140[2], the source electrode is connected to the video signal line 160 in the j-th column, the drain electrode is connected to the data line 114 in the (4j−2)th column (that is, the source electrode of the TFT 116[2] in the j-th pixel group). When a high level of selection signal SEL[2] is supplied to the selection signal line 140[2], the TFT 152[2] is turned on, and the video signal line 160 in the j-th column and the data line 114 in the (4j−2)th column become conductive. That is, the video signal S[j] is supplied to the data line 114 in the (4j−2)th column. When a low level of selection signal SEL[2] is supplied to the selection signal line 140[2], the TFT 152[2] is turned off, and the video signal line 160 in the j-th column and the data line 114 in the (4j−2)th column are brought into a high impedance state.

The gate electrode of the TFT 152[3] is connected to the selection signal line 140[3], the source electrode is connected to the video signal line 160 in the j-th column, the drain electrode is connected to the data line 114 in the (4j−1)th column (that is, the source electrode of the TFT 116[3] in the j-th pixel group). When a high level of selection signal SEL[3] is supplied to the selection signal line 140[3], the TFT 152[3] is turned on, and the video signal line 160 in the j-th column and the data line 114 in the (4j−1)th column become conductive. That is, the video signal S[j] is supplied to the data line 114 in the (4j−1)th column. When a low level of selection signal SEL[3] is supplied to the selection signal line 140[3], the TFT 152[3] is turned off, and the video signal line 160 in the j-th column and the data line 114 in the (4j−1)th column are brought into a high impedance state.

The gate electrode of the TFT 152[4] is connected to the selection signal line 140[4], the source electrode is connected to the video signal line 160 in the j-th column, the drain electrode is connected to the data line 114 in the 4j-th column (that is, the source electrode of the TFT 116[4] in the pixel group in th j-th column). When a high level of selection signal SEL[4] is supplied to the selection signal line 140[4], the TFT 152[4] is turned on, and the video signal line 160 in the j-th column and the data line 114 in the 4j-th column become conductive. That is, the video signal S[j] is supplied to the data line 114 in the 4j-th column. When a low level of selection signal SEL[4] is supplied to the selection signal line 140[4], the TFT 152[4] is turned off, and the video signal line 160 in the j-th column and the data line 114 in the 4j-th column are brought into a high impedance state.

2. Operation

Figure 15:
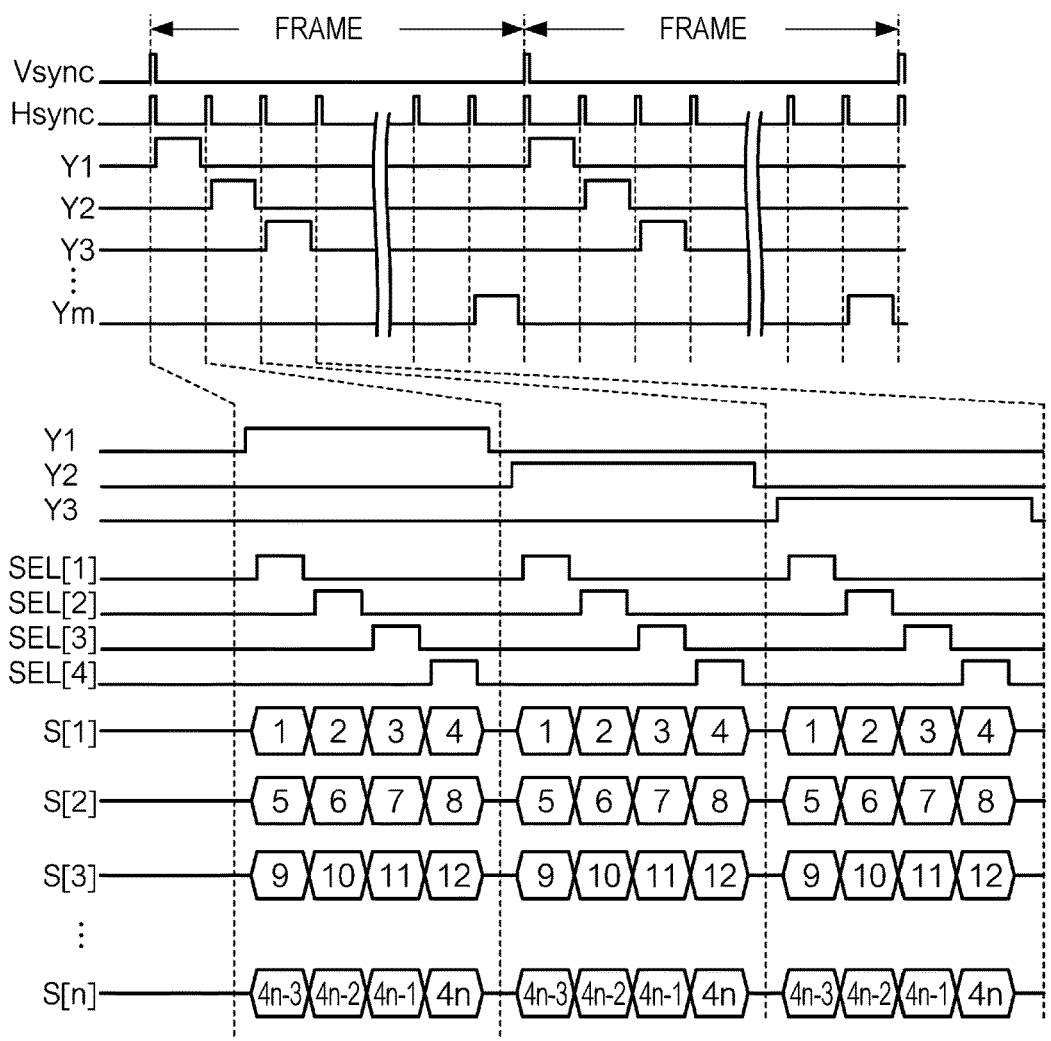
FIG. 15 is a timing chart showing an operation example of an electro-optical device.

FIG. 15 is a timing chart showing an example of an operation of the electro-optical device 1. For the sake of description, a horizontal synchronization signal Hsync, the scanning signals Y1 to Y3, the selection signals SEL[1] to SEL[k] corresponding to the scanning signals Y1 to Y3 at high level timing, and the video signal S[1] to S[n] are shown. In the video signal S[j], the data written to the pixels 111 in the [k×j−k+1]th to the [k×j]th columns, which is the k pieces of pixels 111 in the corresponding pixel group, is time-division multiplexed. In addition, in this example, in a case where S[j] is S[2t−1], the video signal S is supplied from the first drive circuit 22 to the data lines 114 of the odd numbered pixel groups via the video signal input terminal 161A and the video signal line 160A. In a case where S[j] is S[2t], the video signal S is supplied from the second drive circuit 32 to the data lines 114 of the even numbered pixel groups via the video signal input terminal 161B and the video signal line 160B. For example, the video signals S[1] and S[2] are the video signal S supplied to the video signal input terminal 161A and the video signal input terminal 161B, respectively. In this example, k=4, and the four data lines 114 are sequentially arranged in the lateral direction. In the video signal S1 to S(2t−1), the data to be written to the pixels 111 in the first, the second, the third, and the fourth column to the (8t−7)th, the (8t−6)th, the (8t−5)th, and the (8t−4)th column is time-division multiplexed, in the video signal S2 to S(2t), the data to be written to the pixels 111 in the fifth, the sixth, the seventh, and the eighth column to the (8t−3)th, the (8t−2)th, the (8t−1)th, and the (8t)th column is time-division multiplexed. The number written in the waveforms of the video signal in the diagram shows the data lines 114 to which the signal thereof is supplied. For example, data in the period marked "1" in the video signal S1 is supplied to the data line 114 in the first column.

By using the two drive circuits of the first drive circuit 22 and the second drive circuit 32, it is possible to write data to the pixel which is twice as large in one period as compared with the case where these drive circuits are used alone. As described above, the first drive circuit 22 and the second drive circuit 32 are provided in different wiring substrates (the first wiring substrate 20 and the second wiring substrate 30), respectively. By arranging the video signal input terminal 161A to which the video signal supplied from the first drive circuit 22 is input and the video signal input terminal 161B to which the video signal supplied from the second drive circuit 32 is input, in the longitudinal direction, it is possible to achieve smaller size and higher definition as compared with the case where these are arranged in the lateral direction. In addition, high-speed driving becomes also easier.

In the above example, k pieces of data lines 114 are arranged consecutively, but it is also possible to set k pieces of data lines that are not consecutively arranged as one unit. For example, the data lines 114 are alternately connected to the video signal input terminal 161A and the video signal input terminal 161B one by one. That is, the data lines 114 are alternately connected to the first drive circuit 22 and the second drive circuit 32 one by one via the demultiplexer 151 and the video signal line 160 in units of k pieces of non-consecutive data, and are driven respectively. In this example, the first pixel groups are configured to correspond to the data lines 114 in the odd-numbered columns, and the second pixel group is configured to correspond to the data lines 114 in the even-numbered columns. For example, in the case of k=4, the first one of the first pixel groups is configured corresponding to the data lines 114 in the first, the third, the fifth, and the seventh column, and the first one of the second pixel groups is configured to correspond to the data lines 114 in the second, the fourth, the sixth, and the eighth column.

3. Application Example

Figure 16:
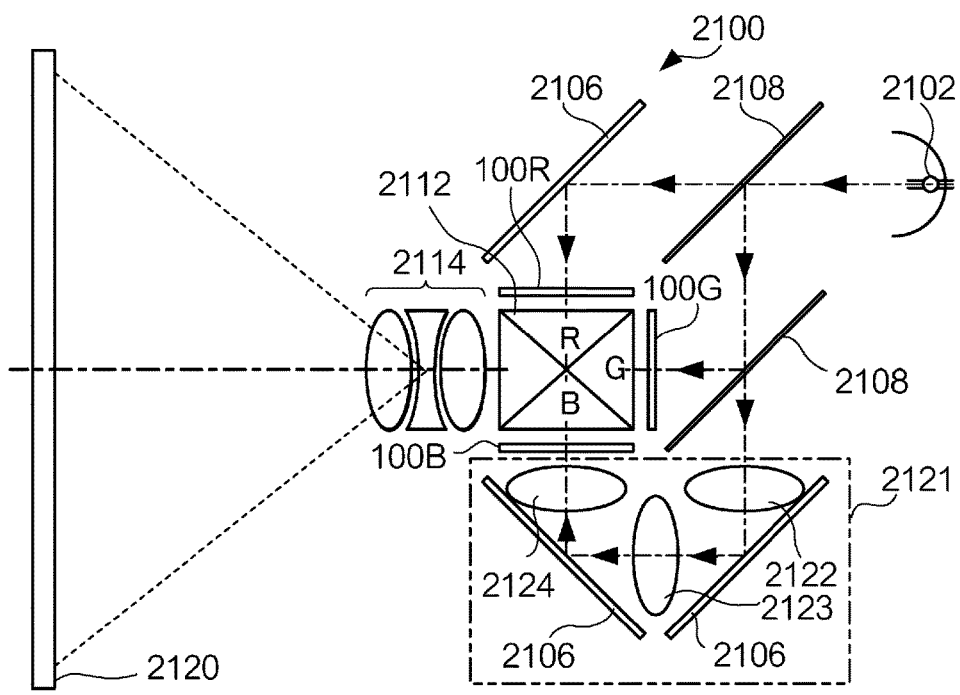
FIG. 16 is a diagram showing a projector according to one embodiment.

FIG. 16 is a diagram showing a projector 2100 according to one embodiment. The projector 2100 is an example of the electronic apparatus using the electro-optical device 1. In the projector 2100, the electro-optical device 1 is used as a light valve, and high-definition and bright display can be achieved without enlarging the device. As shown in the diagram, a lamp unit 2102 having a white light source such as a halogen lamp is provided inside the projector 2100. The projected light emitted from the lamp unit 2102 is separated into three primary colors, red (R) color, green (G) color, and blue (B) color by three mirrors 2106 and two dichroic mirrors 2108 provided inside the lamp unit 2102. The separated projection light is guided to light valves 100R, 100G, and 100B corresponding to the respective primary colors. Since the B color light has a long optical path as compared with the other R color and G color, in order to prevent the loss thereof, the light of the B color is guided through a relay lens system 2121 having an incidence lens 2122, a relay lens 2123, and an emission lens 2124.

In the projector 2100, three sets of liquid crystal display devices including the electro-optical device 1 are provided corresponding to R color, G color, and B color, respectively. The configuration of the light valves 100R, 100G and 100B is similar to that of the electro-optical panel 100 described above, and is connected to the upper circuit in the projector 2100 via the first wiring substrate 20 and the second wiring substrate 30. The video signals specifying the gradation level of each of the primary color components of R color, G color, and B color are supplied from the external upper circuit and processed in the upper circuit in the projector 2100, respectively, and the light valves 100R, 100G and 100B are driven, respectively. Light beams modulated by the light valves 100R, 100G, and 100B are incident to a dichroic prism 2112 from three directions, respectively. Then, in the dichroic prism 2112, the R color light and the B color light are refracted by 90 degrees, and the G color light travels straight. Therefore, after the images of each primary color are synthesized, a color image is projected on a screen 2120 by a projection lens group 2114.

Since light beams corresponding to each of the R, G, and B colors are incident to the light valves 100R, 100G, and 100B by the dichroic mirror 2108, it is not necessary to provide a color filter. In addition, the transmission images of the light valves 100R and 100B are projected after being reflected by the dichroic prism 2112, whereas the transmission image of the light valve 100G is projected as it is. Therefore, the horizontal scanning direction by the light valves 100R and 100B is a direction opposite to the horizontal scanning direction by the light valve 100G, and an image in which the left and right thereof are reversed is displayed.

4. Modification Example

The aspect of the invention is not limited to the above-described embodiments, and various modifications can be made. Several modification examples will be described below. Two or more of the modification examples below may be used in combination.

4-1. Modification Example 1

Figure 17:
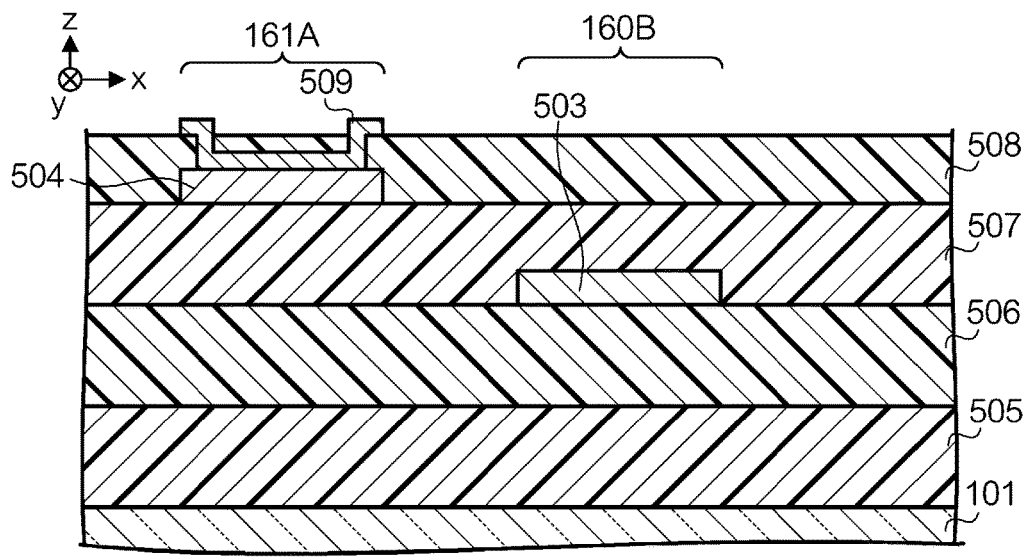
FIG. 17 is a cross-section structure according to a modification example 1 of the video signal line and the video signal input terminal.
Figure 18:
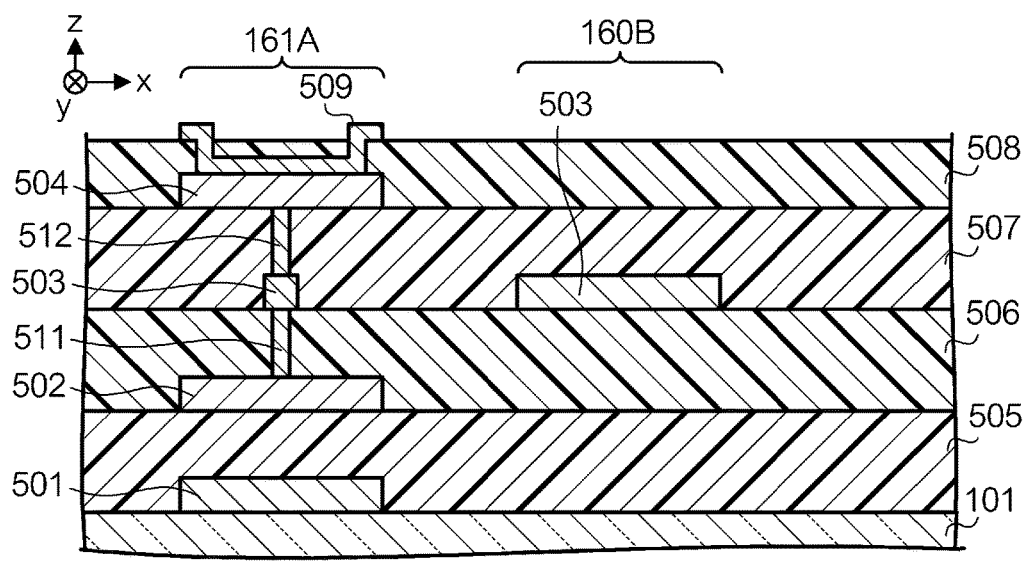
FIG. 18 is a cross-section structure according to a modification example 2 of the video signal line and the video signal input terminal.
Figure 19:
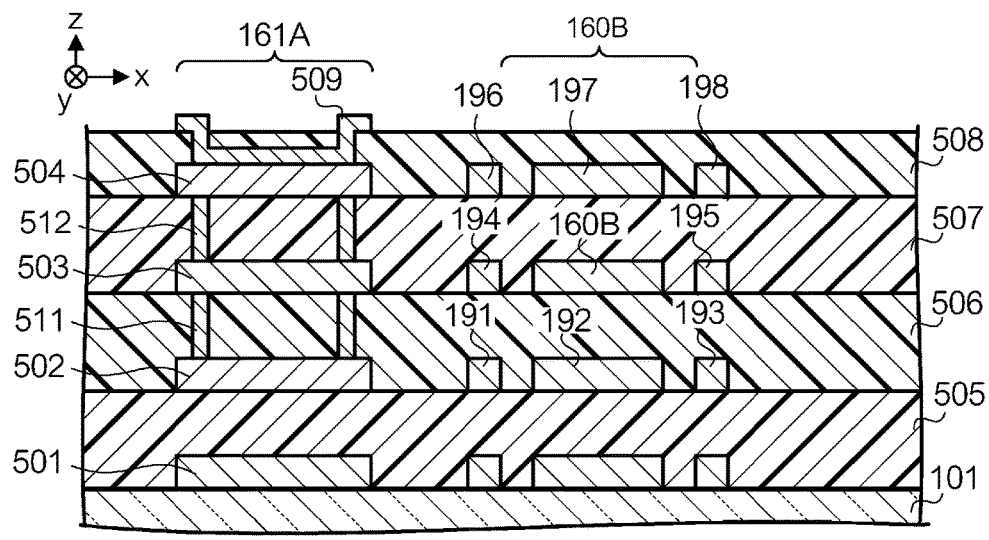
FIG. 19 is a cross-section structure according to a modification example 3 of the video signal line and the video signal input terminal.
Figure 20:
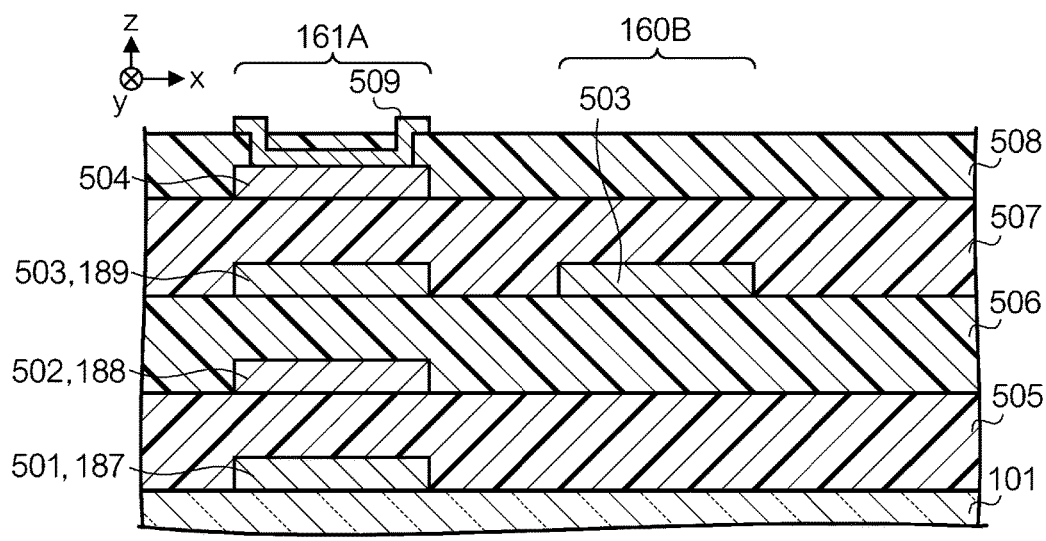
FIG. 20 is a cross-section structure according to a modification example 4 of the video signal line and the video signal input terminal.

FIG. 17 is a schematic diagram showing a cross-section structure according to the modification example 1 of the video signal line 160B and the video signal input terminal 161A. The diagram shows the VIII, XVII-VIII, XVII cross section in FIG. 6 similarly to FIG. 8. The same applies to the subsequent FIGS. 18 to 20 showing a cross-section structure. In the example of FIG. 8, the pattern of the video signal input terminal 161A and the pattern of the video signal line 160B are formed in the same wiring layer (wiring layer 503). However, in the example of FIG. 17, both patterns are formed in the different wiring layers. That is, the pattern of the video signal input terminal 161A is not formed in the wiring layer 503 where the pattern of the video signal line 160B is formed. The pattern of the video signal input terminal 161A is formed on the wiring layer 504, and the pattern of the video signal line 160B is not formed. Although the video signal input terminal 161A (that is, video signal line 160A) and the terminal 161B (that is, video signal line 160B) may be supplied with signals with different waveforms, as in the modification example 1, the video signal input terminal 161A and the video signal line 160B are formed on the different wiring layers, and therefore, compared with the case where both video signal lines are formed on the same wiring layer, the distance therebetween increases and the capacitive coupling becomes weak. That is, it is possible to reduce the interference of signals between the video signal line 160A and the video signal line 160B.

4-2. Modification Example 2

FIG. 18 is a schematic diagram showing a cross-section structure according to the modification example 2 of the video signal line 160B and the video signal input terminal 161A. In this example, the pattern of the video signal input terminal 161A is also formed on the wiring layer 503 where the pattern of the video signal line 160B is formed. However, a width of the pattern of the video signal input terminal 161A in the wiring layer 503 is narrower than that of the pattern of the terminal 161A in the other wiring layers (wiring layer 502 and wiring layer 504), the distance between the video signal line 160B and the video signal input terminal 161A is farther than that in the example in FIG. 8. Therefore, according to a modification example 2, it is possible to reduce signal interference as compared with the example of FIG. 8. Further, since the pattern of the video signal input terminal 161A is connected across the wiring layer 502, the wiring layer 503, and the wiring layer 504, it is possible to improve the redundancy of the video signal input terminal 161 compared to the example in FIG. 12 (the terminal portion can be kept low resistance).

4-3. Modification Example 3

FIG. 19 is a schematic diagram showing a cross-section structure according to the modification example 3 of the video signal line 160B and the video signal input terminal 161A. In this example, shield wirings 191 to 198 for shielding signal interference are formed around the pattern of the video signal line 160B. Specifically, the pattern of the video signal line 160B is formed on the wiring layer 503, and the shield wirings 191 to 198 serving as a shield are formed in each of the wiring layer 502, the wiring layer 503, and the wiring layer 504. A predetermined potential, for example, a ground potential is applied to the shield wirings 191 to 198. According to this example, it is possible to further reduce the interference to the video signal line 160B. In this example, at least one of the shield wirings 191 to 198 may be omitted.

4-4. Modification Example 4

FIG. 20 is a schematic diagram showing a cross-section structure according to the modification example 4 of the video signal line 160B and the video signal input terminal 161A. In this example, shield wirings 187 to 189 are formed around the pattern of the video signal input terminal 161A. More specifically, the shield wirings 187 to 189 are formed in an area overlapping with the video signal input terminal 161A when viewed from a direction perpendicular to the element substrate 101. According to this example, it is possible to suppress the wiring load of the video signal line 160B. In addition to the area overlapping with the video signal input terminal 161A, shield wirings may be also formed in an area overlapping with the video signal line 160A when viewed from a direction perpendicular to the element substrate 101.

4-5. Modification Example 5

Figure 21:
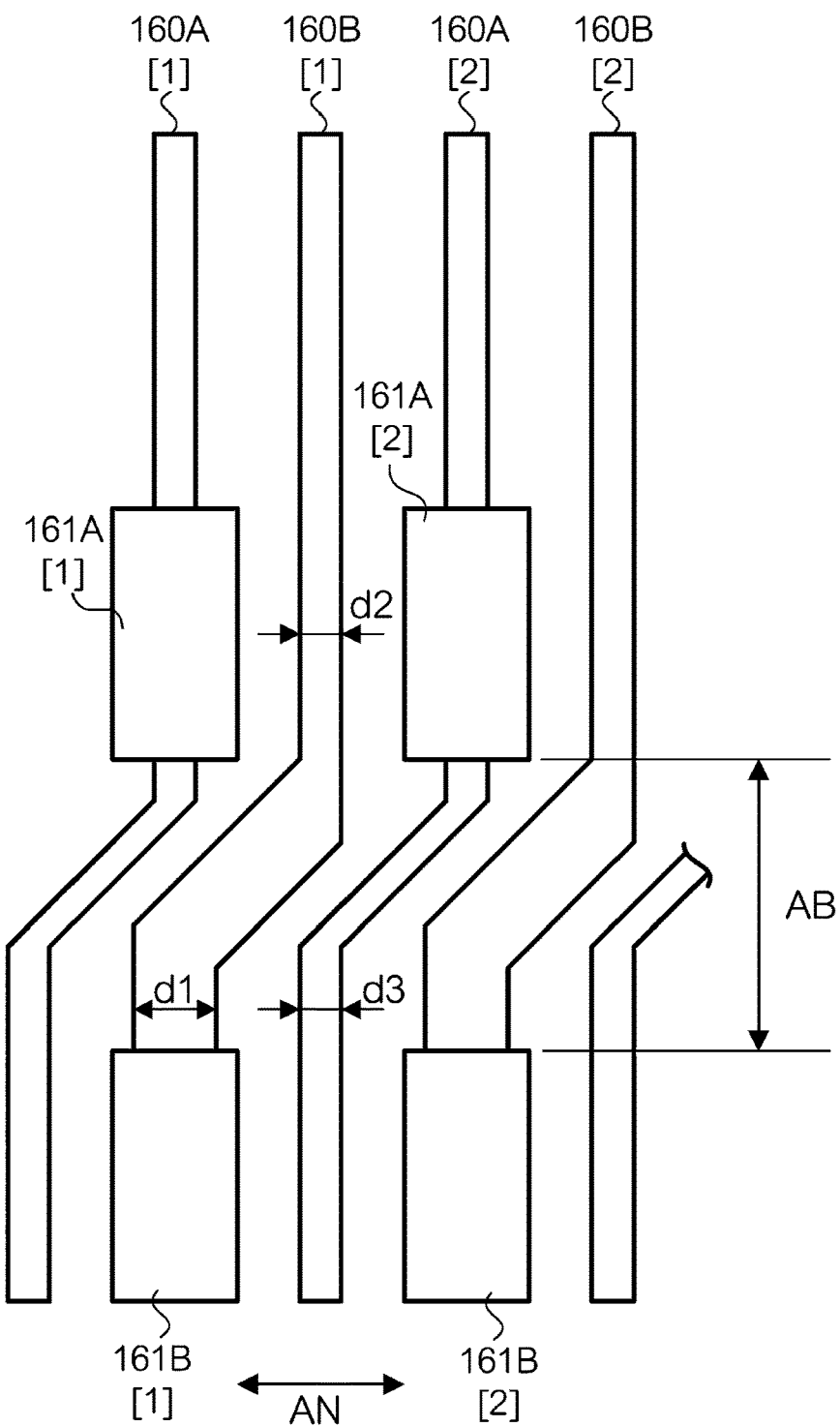
FIG. 21 is a structure according to a modification example 5 of the video signal line and the video signal input terminal.

FIG. 21 is a diagram showing a configuration of the video signal line 160 and the video signal input terminal 161 according to a modification example 5. In this example, in the video signal line 160B, a wiring width d1 in the area AB between the video signal input terminal 161A and the video signal input terminal 161B is wider than a wiring width d2 in an area AN between two adjacent video signal input terminals 161A (d1>d2). According to this example, it is possible to reduce the resistance of the video signal line 160B.

Further, in this example, the video signal line 160A also extends from the video signal input terminal 161A to the video signal input terminal 161B side. Since there is no circuit on the electro-optical panel 100, from the circuit point of view, the video signal line 160A may extend from the video signal input terminal 161A to the pixel area 110 and need not extend from the video signal input terminal 161A to the video signal input terminal 161B side. However, since the video signal line 160A extends to the video signal input terminal 161B side, it is possible to simplify a test signal input during a manufacturing stage, or to make the surface of the electro-optical panel flatter. In this example, a wiring width d3 of the portion of the video signal line 160A extending from the video signal input terminal 161A to the video signal input terminal 161B is narrower than the wiring width d1 and equal to the wiring width d2 (d3<d1, d3=d2). According to this example, it is possible to increase a width of the video signal input terminal 161B.

In the example of FIG. 21, the video signal line 160A may not extend from the video signal input terminal 161A to the video signal input terminal 161B side. Alternatively, in a case where the video signal line 160A extends from the video signal input terminal 161A to the video signal input terminal 161B side, the wiring width may be d1=d2.

4-6. Modification Example 6

Figure 22:
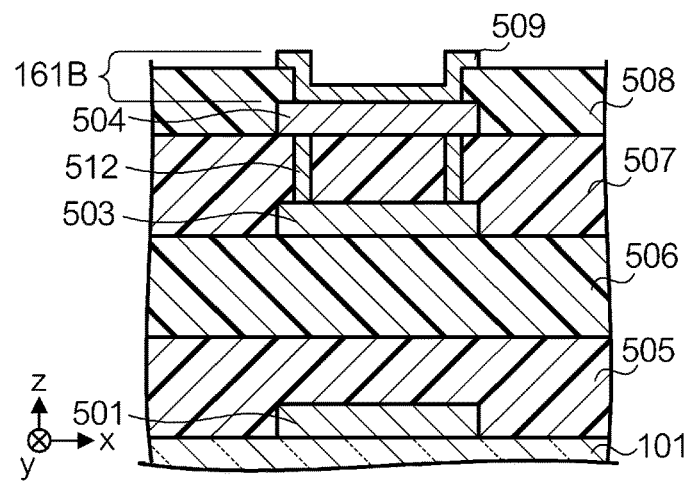
FIG. 22 is a schematic diagram showing a cross-section structure according to a modification example 6 of the video signal input terminal.
Figure 23:
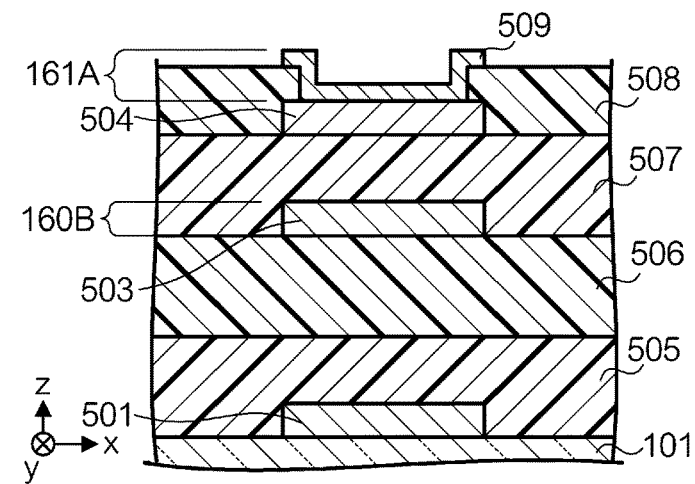
FIG. 23 is the modification example 6 of the video signal line and the video signal input terminal.
Figure 24:
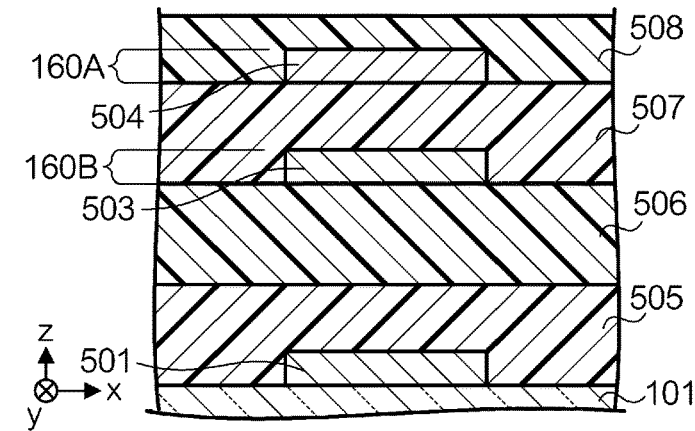
FIG. 24 is a cross-section structure diagram according to the modification example 6 of the video signal line and the video signal line.

FIGS. 22 to 24 are schematic diagrams showing the cross-section structure according to the modification example 6 of the video signal line 160 and the video signal input terminal 161. FIGS. 22, 23, and 24 show the XI, XXII, XXV, XXVIII, XXXI-XI, XXII, XXV, XXVIII, XXXI cross section, the XII, XXIII, XXVI, XXIX, XXXII-XII, XXIII, XXVI, XXIX, XXXII cross section, and the XIII, XXIV, XXVII, XXX, XXXIII-XIII, XXIV, XXVII, XXX, XXXIII cross section in FIG. 10, respectively. In the examples of FIGS. 11 to 13, the video signal line 160B is formed on a single wiring layer, but the video signal line 160A is formed on the two wiring layers. By contrast, in the example of FIGS. 22 to 24, the video signal line 160A and the video signal line 160B are each formed on two different sets of wiring layers, respectively. First, in the XI, XXII, XXV, XXVIII, XXXI-XI, XXII, XXV, XXVIII, XXXI cross section (the position where the video signal input terminal 161B is formed), the pattern corresponding to the video signal input terminal 161B is formed on the wiring layer 503 and the wiring layer 504, and the wiring layer 503 and the wiring layer 504 are short-circuited via the contact hole 512. Next, in the XII, XXIII, XXVI, XXIX, XXXII-XII, XXIII, XXVI, XXIX, XXXII cross section (the position where the video signal input terminal 161A is formed), the pattern corresponding to the video signal line 160B is formed on the wiring layer 503 only, and the pattern corresponding to the terminal 161A is formed on the wiring layer 504 only, respectively. In the XIII, XXIV, XXVII, XXX, XXXIII-XIII, XXIV, XXVII, XXX, XXXIII cross section (the position between the terminal group A and the demultiplexer 151), the pattern corresponding to the video signal line 160B is formed on the wiring layer 503 only, and the pattern corresponding to the video signal line 160A is formed on the wiring layer 504 only, respectively. According to this example, it is possible to more uniform the characteristics of the video signal line 160A and the video signal line 160B as compared with the examples of FIGS. 7 to 9.

4-7. Modification Example 7

Figure 25:
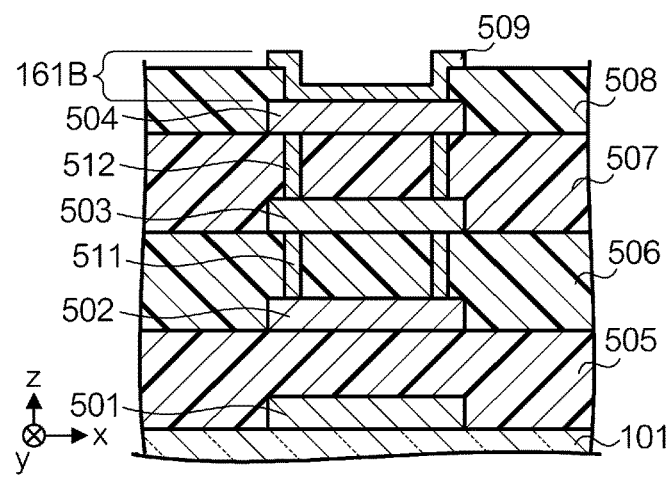
FIG. 25 is a schematic diagram showing a cross-section structure according to a modification example 7 of the video signal input terminal.
Figure 26:
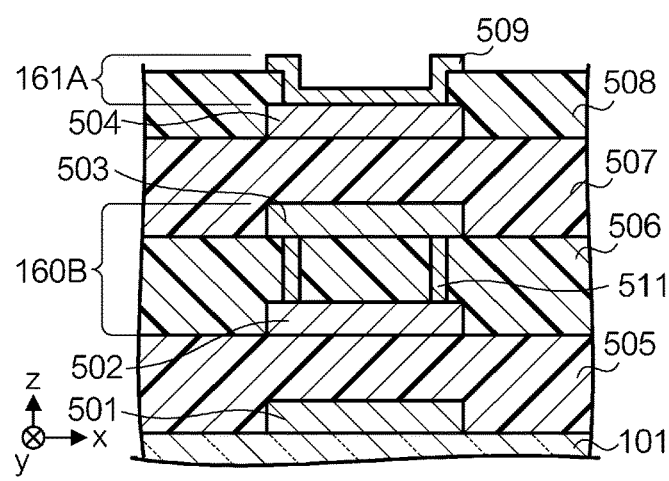
FIG. 26 is the modification example 7 of the video signal line and the video signal input terminal.
Figure 27:
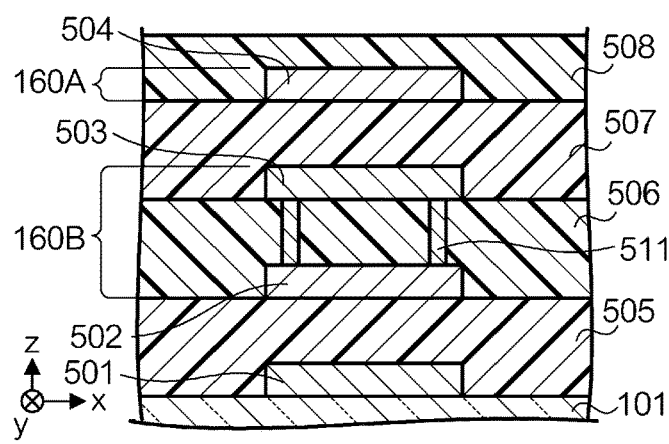
FIG. 27 is a schematic diagram showing a cross-section structure according to the modification example 7 of the video signal lines.

FIGS. 25 to 27 are schematic diagrams showing the cross-section structure according to the modification example 1 of the video signal line 160 and the terminal 161. FIGS. 25, 26, and 27 show the XI, XXII, XXV, XXVIII, XXXI-XI, XXII, XXV, XXVIII, XXXI cross section, the XII, XXIII, XXVI, XXIX, XXXII-XII, XXIII, XXVI, XXIX, XXXII cross section, and the XIII, XXIV, XXVII, XXX, XXXIII-XIII, XXIV, XXVII, XXX, XXXIII cross section in FIG. 10, respectively. Conversely, in the example of FIGS. 11 to 13, the video signal line 160A is formed on a single wiring layer, and the video signal line 160B is formed on two wiring layers. Conversely, in the example of FIGS. 25 to 27, the video signal line 160A is formed on a single wiring layer, and the video signal line 160B is formed on two wiring layers. First, in the XI, XXII, XXV, XXVIII, XXXI-XI, XXII, XXV, XXVIII, XXXI cross section (the position where the video signal input terminal 161B is formed), the pattern corresponding to the video signal input terminal 161B is formed on the wiring layer 502, the wiring layer 503, and the wiring layer 504, and these layers are short-circuited via the contact hole 511 and the contact hole 512. Next, in the XII, XXIII, XXVI, XXIX, XXXII-XII, XXIII, XXVI, XXIX, XXXII cross section (the position where the video signal input terminal 161A is formed), the pattern corresponding to the video signal line 160B is formed on the wiring layer 502 and the wiring layer 503, and these layers are short-circuited via the contact hole 512. The pattern corresponding to the video signal input terminal 161A is formed on the wiring layer 504 only. In the XIII, XXIV, XXVII, XXX, XXXIII-XIII, XXIV, XXVII, XXX, XXXIII cross section (the position between the terminal group A and the demultiplexer 151), the pattern corresponding to the video signal line 160B is formed on the wiring layer 502 and the wiring layer 503, and the pattern corresponding to the video signal line 160A is formed on the wiring layer 504 only. According to this example, it is possible to make the video signal line 160B redundant as compared with the examples of FIGS. 22 to 24.

In this example, the first terminal (video signal input terminal 161A[1]) and the second terminal (the video signal input terminal 161A[2]) are formed on the layer (wiring layer 504) of the outermost surface among at least three wiring layers. The first signal line (160B) is formed on the layer (wiring layer 502) that is the closest to the element substrate 101 among these wiring layers. A pattern (pattern of the video signal line 160B of the wiring layer 503) to be short-circuited with the first signal line (video signal line 160B) is formed on the second layer (wiring layer 503) from the element substrate 101 among these wiring layers.

4-8. Modification Example 8

Figure 28:
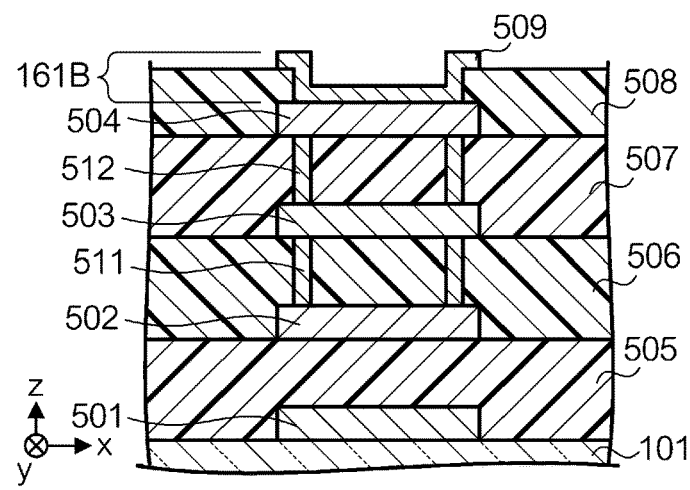
FIG. 28 is a schematic diagram showing a cross-section structure according to a modification example 8 of the video signal input terminal.
Figure 29:
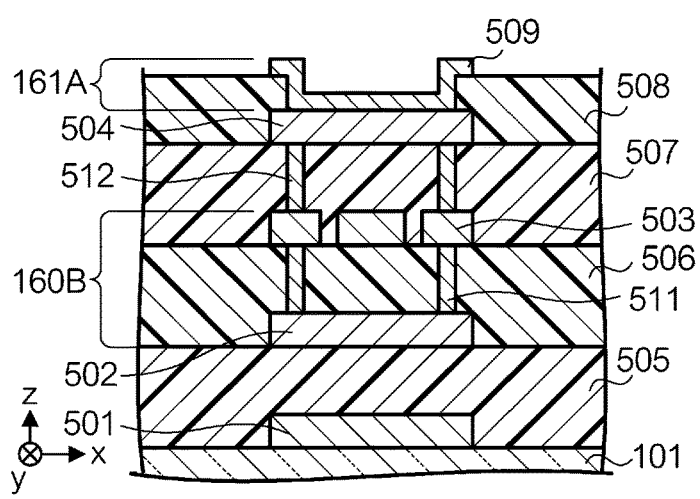
FIG. 29 is the modification example 8 of the video signal line and the video signal input terminal.
Figure 30:
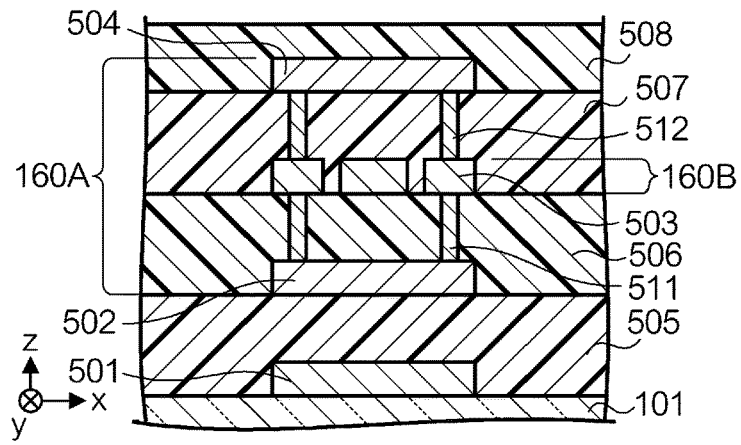
FIG. 30 is a cross-section structure according to the modification example 8 of the video signal lines.

FIGS. 28 to 30 are schematic diagrams showing the cross-section structure according to the modification example 1 of the video signal line 160 and the terminal 161. FIGS. 27, 28, and 29 show the XI, XXII, XXV, XXVIII, XXXI-XI, XXII, XXV, XXVIII, XXXI cross section, the XII, XXIII, XXVI, XXIX, XXXII-XII, XXIII, XXVI, XXIX, XXXII cross section, and the XIII, XXIV, XXVII, XXX, XXXIII-XIII, XXIV, XXVII, XXX, XXXIII cross section in FIG. 10, respectively. In the examples of FIGS. 28 to 30, the video signal line 160A is formed across a plurality of the wiring layers, and the video signal line is formed on a wiring layer between the plurality of the wiring layers. First, in the XI, XXII, XXV, XXVIII, XXXI-XI, XXII, XXV, XXVIII, XXXI cross section (the position where the video signal input terminal 161B is formed), the pattern corresponding to the video signal input terminal 161B is formed on the wiring layer 502, the wiring layer 503, and the wiring layer 504, and these layers are short-circuited via the contact hole 511 and the contact hole 512. Next, in the XII, XXIII, XXVI, XXIX, XXXII-XII, XXIII, XXVI, XXIX, XXXII cross section (the position where the video signal input terminal 161A is formed), the pattern corresponding to the video signal line 160B is formed in the wiring layer 503 only. The pattern corresponding to the video signal input terminal 161A is formed on the wiring layer 502, the wiring layer 503, and the wiring layer 504. The pattern formed on the wiring layer 503 of the video signal input terminal 161A is a pattern for mediating the pattern of the wiring layer 504 and the pattern of the wiring layer 502. Therefore, the pattern of the wiring layer 503 may have a size enough to form the contact hole 511 and the contact hole 512. In the XIII, XXIV, XXVII, XXX, XXXIII-XIII, XXIV, XXVII, XXX, XXXIII cross section (the position between the terminal group A and the demultiplexer 151), the pattern corresponding to the video signal line 160B is formed on the wiring layer 502, and the pattern corresponding to the video signal line 160A is formed on the wiring layer 502, the wiring layer 503, and the wiring layer 504. According to this example, it is possible to improve the redundancy of the video signal input terminal 161A while securing the redundancy of the video signal input terminal 161B.

In this example, the first terminal (video signal input terminal 161A[1]) and the second terminal (the video signal input terminal 161A[2]) are formed on the layer (wiring layer 504) of the outermost surface among at least three wiring layers. The first terminal and the second terminal are formed on the first wiring layer (wiring layer 504)) of the outermost surface among these wiring layers. A pattern to be short-circuited with the layers of the first terminal and the second terminal (pattern of the video signal input terminal 161A of the wiring layer 502) is formed on the second layer (wiring layer 502) of the third and subsequent layers from the outermost surface among these wiring layers. The first signal line (video signal line 160B) is formed on the layer (wiring layer 503) between the first layer and the second layer among these wiring layers.

4-9. Modification Example 9

Figure 31:
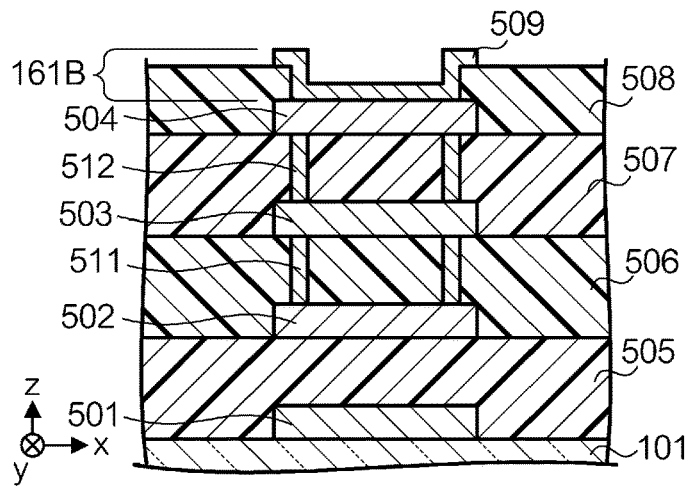
FIG. 31 is a schematic diagram showing a cross-section structure according to a modification example 9 of the video signal input terminal.
Figure 32:
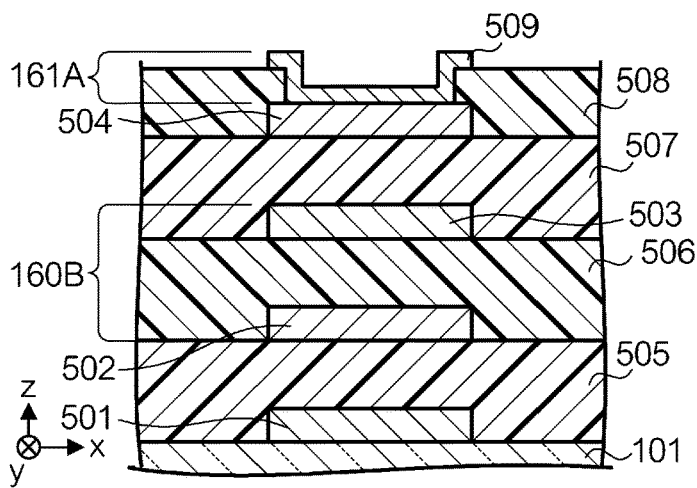
FIG. 32 is the modification example 9 of the video signal lines.
Figure 33:
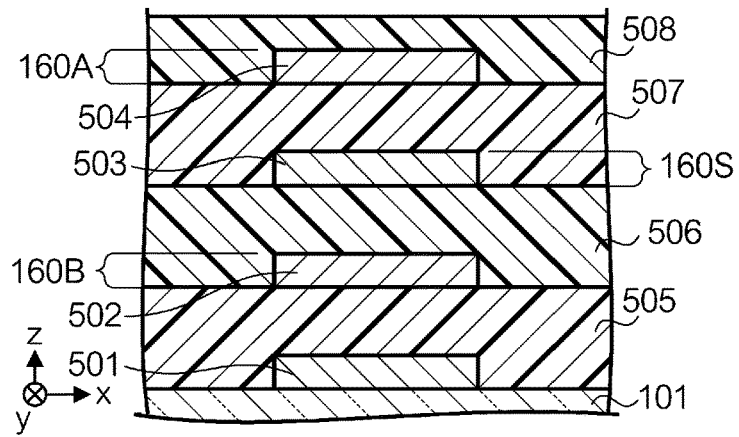
FIG. 33 is a cross-section structure according to the modification example 9 of the video signal lines.

FIGS. 31 to 33 are schematic diagrams showing the cross-section structure according to the modification example 1 of the video signal line 160 and the video signal input terminal 161. FIGS. 31, 32, and 33 show the XI, XXII, XXV, XXVIII, XXXI-XI, XXII, XXV, XXVIII, XXXI cross section, the XII, XXIII, XXVI, XXIX, XXXII-XII, XXIII, XXVI, XXIX, XXXII cross section, and the XIII, XXIV, XXVII, XXX, XXXIII-XIII, XXIV, XXVII, XXX, XXXIII cross section in FIG. 10, respectively. In the examples of FIGS. 31 to 33, between the video signal line 160A and the video signal line 160B, a shield wiring 160S is formed for shielding (suppressing) the interference therebetween. First, in the XI, XXII, XXV, XXVIII, XXXI-XI, XXII, XXV, XXVIII, XXXI cross section (the position where the video signal input terminal 161B is formed), the pattern corresponding to the video signal input terminal 161B is formed on the wiring layer 502, the wiring layer 503, and the wiring layer 504, and these layers are short-circuited via the contact hole 511 and the contact hole 512. Next, in the XII, XXIII, XXVI, XXIX, XXXII-XII, XXIII, XXVI, XXIX, XXXII cross section (the position where the video signal input terminal 161A is formed), the pattern corresponding to the video signal line 160B is formed in the wiring layer 502 only. The pattern corresponding to the video signal input terminal 161A is formed on the wiring layer 504 only. The pattern of the shield wiring 160S is formed on the wiring layer 503 located therebetween. In the XIII, XXIV, XXVII, XXX, XXXIII-XIII, XXIV, XXVII, XXX, XXXIII cross section (the position between the terminal group A and the demultiplexer 151), the pattern corresponding to the video signal line 160B is formed on the wiring layer 502, and the pattern corresponding to the video signal line 160A is formed on the wiring layer 504. In addition, the pattern corresponding to the shield wiring 160S is formed on the wiring layer 503. According to this example, it is possible to reduce the interference between the video signal line 160A and the video signal line 160B as compared with the example without a shield wiring.

In this example, the first terminal (terminal 161A[1]) and the second terminal (the video signal input terminal 161A[2]) are formed on the layer (wiring layer 504) of the outermost surface among at least three wiring layers. The first terminal and the second terminal are formed on the first wiring layer (wiring layer 504) among these wiring layers. The first signal line (video signal line 160B) is formed on the second layer (wiring layer 502) different from the first layer among these wiring layers. A pattern (shield wiring 160S) for shielding the first signal line from the first terminal and the second terminal is form on the layer (wiring layer 503) between the first layer and the second layer among these wiring layers.

4-10. Other Modification Examples

The number of the wiring substrates bonded with the electro-optical panel 100 is not limited to two. Three or more wiring substrates may be bonded to the electro-optical panel 100. In the above embodiment, since the two wiring substrates are used, the terminal group is arranged in two stages, but for example in a case where three wiring substrates are used, the terminal group will be arranged in three stages.

The electro-optical panel 100 is not limited to a transparent liquid crystal panel. The electro-optical panel 100 may be a reflective type liquid crystal panel. In addition, the liquid crystal used is not limited to a VA type liquid crystal, but other types of liquid crystals such as a Twisted Nematic (TN) type and an In Plane Switching (IPS) type may be used. Alternatively, the electro-optical panel 100 may use electro-optical elements other than a liquid crystal, such as a Digital Mirror Device (DMD) and an organic Electroluminescence (EL) element.

The electronic apparatus using the electro-optical panel 100 is not limited to the projector 2100 illustrated in FIG. 10. The electro-optical panel 100 may be applied to an electronic apparatus having a direct view type display device such as a television, an electronic view finder, a car navigation device, a pager, an electronic organizer, an electronic calculator, a word processor, a workstation, a video phone, a POS terminal, a digital still camera, a mobile phone, a smartphone, a tablet type terminal, or the like.

Priority is claimed under 35 U.S.C. § 119 from Japanese patent application nos. JP 2016-146310 filed on Jul. 26, 2016 and JP 2016-146311 filed on Jul. 26, 2016, which are hereby incorporated by reference in their entirety.

What is claimed is:

1. An electro-optical device comprising:
a substrate;
a first terminal that is formed on the substrate;
a second terminal that is formed on the substrate, and arranged in a first direction with respect to the first terminal;
a third terminal that is formed on the substrate and arranged in a second direction different from the first direction with respect to the first terminal, and of which the position in the first direction is the same as the first terminal;
a wiring connected to the third terminal and that is formed on the substrate;
a fourth terminal that is formed on the substrate and arranged in the first direction with respect to the third terminal; and
a wiring connected to the second terminal, and that is formed on the substrate, the wiring connected to the second terminal being arranged at a position in an area between the second terminal and the fourth terminal and at a position in an area between the third terminal and the fourth terminal, wherein
in the wiring connected to the third terminal, a first wiring width between the first terminal and the third terminal is wider than a second wiring width between the first terminal and the second terminal,
a third wiring width of the wiring connected to the second terminal is narrower than the first wiring width between the first terminal and the third terminal of the wiring connected to the third terminal, and
the second wiring width is equal to the third wiring width.

2. The electro-optical device according to claim 1, wherein the wiring connected to the third terminal is formed at a position passing between the first terminal and the second terminal.

3. The electro-optical device according to claim 2, further comprising:
a first wiring layer and a second wiring layer that are formed on the substrate,
wherein the first terminal and the second terminal are formed on the first wiring layer, and
the wiring connected to the third terminal is formed on the second wiring layer.

4. The electro-optical device according to claim 3, further comprising:
a third wiring layer that is formed on the substrate,
wherein the first wiring layer, the second wiring layer, and the third wiring layer are conductive in an area where the first terminal or the second terminal overlaps with the third wiring layer.

5. The electro-optical device according to claim 2, further comprising:
a shield wiring for shielding the wiring connected to the third terminal.

6. The electro-optical device according to claim 1, further comprising:
a first wiring substrate that is connected to the first terminal; and
a second wiring substrate that is connected to the third terminal.

7. The electro-optical device according to claim 6, wherein the first wiring substrate and the second wiring substrate have a same function and have a same shape.

8. The electro-optical device according to claim 6, wherein the first wiring substrate includes a first drive circuit that supplies video signals to a first pixel group, and
the second wiring substrate includes a second drive circuit that supplies video signals to a second pixel group different from the first pixel group.

9. The electro-optical device according to claim 6, wherein the first wiring substrate and the second wiring substrate are connected to one side of the substrate.

10. The electro-optical device according to claim 6, wherein the first wiring substrate is connected on a first side of the substrate and the second wiring substrate is connected at a second side opposite to the first side.

11. An electronic apparatus comprising:
the electro-optical device according to claim 1.

12. An electro-optical device comprising:
a first terminal;
a second terminal that is arranged in a first direction with respect to the first terminal;
a third terminal that is arranged in a second direction different from the first direction with respect to the first terminal, and of which a position in the first direction is the same as the first terminal;
a fourth terminal that is arranged in the first direction with respect to the third terminal, and of which the position in the first direction is the same as the second terminal;
a first wiring substrate that is electrically connected to the first terminal and the second terminal;
a second wiring substrate that is electrically connected to the third terminal and the fourth terminal;
a first video signal wiring that is electrically connected to the first terminal;
a second video signal wiring that is electrically connected to the second terminal;
a third video signal wiring that is electrically connected to the third terminal, a first wiring width of the third video signal wiring between the first terminal and the third terminal is wider than a second wiring width of the third video signal wiring between the first terminal and the second terminal;
a fourth video signal wiring that is electrically connected to the fourth terminal;
a wiring that is electrically connected to the second terminal and that is extended in the second direction between the third terminal and the fourth terminal, a third wiring width of the wiring is narrower than the first wiring width of the third video signal wiring and is equal to the second wiring width of the third video signal wiring;
a first demultiplexer that is that is electrically connected to the first video signal and that is disposed corresponding to a first pixel group;
a second demultiplexer that is that is electrically connected to the third video signal, the second demultiplexer being disposed corresponding to a second pixel group that is disposed adjacent to the first pixel group;
a third demultiplexer that is that is electrically connected to the second video signal, the third demultiplexer being disposed corresponding to a third pixel group that is disposed adjacent to the second pixel group; and
a fourth demultiplexer that is that is electrically connected to the fourth video signal, the fourth demultiplexer being disposed corresponding to a fourth pixel group that is disposed adjacent to the third pixel group.

* * * * *